(12) United States Patent
Choi et al.

(10) Patent No.: US 11,605,698 B2
(45) Date of Patent: Mar. 14, 2023

(54) DISPLAY PANEL INCLUDING BYPASSING SIGNAL LINES

(71) Applicant: Samsung Display Co., Ltd., Yongin-Si (KR)

(72) Inventors: Minhee Choi, Yongin-si (KR); Youngsoo Yoon, Yongin-si (KR); Yunkyeong In, Yongin-si (KR); Hyunji Cha, Yongin-si (KR)

(73) Assignee: Samsung Display Co., Ltd.

( * ) Notice: Subject to any disclaimer, the term of this patent is extended or adjusted under 35 U.S.C. 154(b) by 128 days.

(21) Appl. No.: 17/148,613

(22) Filed: Jan. 14, 2021

(65) Prior Publication Data

US 2021/0134937 A1    May 6, 2021

Related U.S. Application Data

(63) Continuation of application No. 16/437,042, filed on Jun. 11, 2019, now Pat. No. 10,923,552.

(30) Foreign Application Priority Data

Nov. 27, 2018  (KR) .......................... 10-2018-0148770

(51) Int. Cl.
*H01L 27/14* (2006.01)
*H01L 27/32* (2006.01)
(Continued)

(52) U.S. Cl.
CPC ........ *H01L 27/3276* (2013.01); *H01L 27/323* (2013.01); *H01L 51/5275* (2013.01);
(Continued)

(58) Field of Classification Search
CPC .............. H01L 27/3276; H01L 27/323; H01L 27/3225; H01L 27/14678; H01L 27/3297;
(Continued)

(56) References Cited

U.S. PATENT DOCUMENTS 7,369,209 B2   5/2008   Kinoshita et al.
8,890,181 B2   11/2014  Wang et al.
(Continued)

FOREIGN PATENT DOCUMENTS

CN     108847415 A    11/2018
EP     3226101 A1     10/2017
(Continued)

*Primary Examiner* — Ida M Soward
(74) *Attorney, Agent, or Firm* — Innovation Counsel LLP

(57) ABSTRACT

A display panel includes a substrate including a first area and a second area that are spaced apart from each other in a first direction; a plurality of display elements located in a display area, the display area being adjacent to the first area and the second area; and a plurality of lines extending in a second direction that intersects the first direction, the plurality of lines being electrically respectively connected to the plurality of display elements, wherein the plurality of lines include: a first line and a second line adjacent to each other and bypassing along an edge of the first area; and a third line and a fourth line adjacent to each other and bypassing along an edge of the second area, wherein the first area and the second area are different from each other in at least one of size or shape.

19 Claims, 28 Drawing Sheets

(51) Int. Cl.
  *H01L 51/50*   (2006.01)
  *H01L 51/52*   (2006.01)
  *G02F 1/13*    (2006.01)
  *G09F 9/33*    (2006.01)
  *G02F 1/1335*      (2006.01)
  *H01L 27/146*      (2006.01)

(52) U.S. Cl.
  CPC .... *H01L 51/5281* (2013.01); *G02F 1/133528* (2013.01); *G09G 2300/0408* (2013.01); *G09G 2300/0804* (2013.01); *H01L 27/14678* (2013.01); *H01L 27/3211* (2013.01); *H01L 27/3246* (2013.01); *H01L 27/3265* (2013.01); *H01L 27/3272* (2013.01); *H01L 51/5246* (2013.01); *H01L 51/5293* (2013.01); *H01L 2251/301* (2013.01)

(58) Field of Classification Search
  CPC ............. H01L 27/3246; H01L 27/3295; H01L 27/3211; H01L 27/3272; H01L 27/3265; H01L 51/5275; H01L 51/5281; H01L 51/50; H01L 51/5246; H01L 51/5293; H01L 2251/301; G02F 1/133528; G02F 2001/133357; G09F 9/33; G09G 2300/0408; G09G 2300/0804
  See application file for complete search history.

(56) References Cited

U.S. PATENT DOCUMENTS

| | | | |
|---|---|---|---|
| 10,096,800 B2 | 10/2018 | Chung et al. | |
| 10,212,833 B2 | 2/2019 | Seo et al. | |
| 10,747,380 B2 | 8/2020 | Lee et al. | |
| 10,978,666 B2* | 4/2021 | Park | H01L 27/3234 |
| 2010/0079065 A1 | 4/2010 | Kamura | |
| 2014/0354700 A1 | 12/2014 | Hong | |
| 2015/0365508 A1 | 12/2015 | Kwon et al. | |
| 2016/0020264 A1 | 1/2016 | Choo et al. | |
| 2016/0127524 A1 | 5/2016 | Kanemaki et al. | |
| 2016/0210893 A1* | 7/2016 | Lee | G06F 1/1643 |
| 2016/0306488 A1 | 10/2016 | Kim et al. | |
| 2017/0288002 A1 | 10/2017 | Kim et al. | |
| 2017/0294502 A1* | 10/2017 | Ka | H01L 27/3276 |
| 2018/0076416 A1 | 3/2018 | Cho et al. | |
| 2018/0164850 A1 | 6/2018 | Sim et al. | |
| 2019/0006616 A1 | 1/2019 | Nishimura et al. | |
| 2019/0043414 A1* | 2/2019 | Wu | G09G 3/20 |
| 2019/0115415 A1* | 4/2019 | Choi | H01L 27/323 |
| 2019/0123066 A1 | 4/2019 | Zhan et al. | |
| 2019/0130822 A1 | 5/2019 | Jung et al. | |
| 2019/0138123 A1 | 5/2019 | Jung et al. | |
| 2019/0155502 A1 | 5/2019 | Zhang et al. | |
| 2019/0243417 A1 | 8/2019 | Cheng | |
| 2020/0013849 A1* | 1/2020 | Kim | H01L 27/3262 |
| 2020/0235194 A1* | 7/2020 | Ito | G09G 3/3266 |
| 2020/0236259 A1* | 7/2020 | Nakamura | G02F 1/133512 |
| 2020/0296190 A1 | 9/2020 | Zhang | |
| 2021/0234125 A1* | 7/2021 | Sung | H01L 27/3258 |
| 2021/0343823 A1* | 11/2021 | Tanaka | G09F 9/30 |

FOREIGN PATENT DOCUMENTS

| | | |
|---|---|---|
| EP | 3428967 A1 | 1/2019 |
| JP | 5955298 B2 | 7/2016 |
| KR | 10-2017-0113066 A | 10/2017 |
| KR | 10-2018-0049296 A | 5/2018 |
| KR | 10-2018-0065722 A | 6/2018 |

* cited by examiner

DISPLAY PANEL INCLUDING BYPASSING SIGNAL LINES

CROSS-REFERENCE TO RELATED APPLICATION

This application is a continuation application of U.S. patent application Ser. No. 16/437,042 filed on Jun. 11, 2019, which claims priority under 35 USC § 119 to Korean Patent Application No. 10-2018-0148770, filed on Nov. 27, 2018, in the Korean Intellectual Property Office, the disclosures of which are incorporated herein in their entirety by reference.

BACKGROUND

1. Field

One or more embodiments relate to a display panel, and more particularly, to a display panel including lines that bypass a specific area and a display apparatus including the display panel.

2. Description of the Related Art

Recently, display apparatuses have been widely used. Also, as thicknesses and weights of display apparatuses have decreased, applications of the display apparatuses have increased.

As display apparatuses have been used in various ways, there may be various methods of designing the display apparatuses and functions that may be linked to or associated with the display apparatuses have increased.

SUMMARY

In order to increase functions that may be linked to or associated with display apparatuses, a display panel and an apparatus including a plurality of areas where a camera, a sensor, and so on may be located inside a display area may be provided. However, in this case, there is a problem in that wirings around the plurality of areas bypass the areas, thereby increasing a dead area.

To solve various problems including the above problem, the present disclosure may provide a structure that may reduce the dead area around the plurality of areas. However, the problems are merely examples, and thus do not limit the scope of the present disclosure.

Additional aspects will be set forth in part in the description which follows and, in part, will be apparent from the description, or may be learned by practice of the presented embodiments.

According to one or more embodiments, a display panel includes: a substrate including a first area and a second area that are spaced apart from each other in a first direction; a plurality of display elements located in a display area, the display area being adjacent to the first area and the second area; and a plurality of lines extending in a second direction that intersects the first direction, the plurality of lines being electrically connected to the plurality of display elements, respectively.

The plurality of lines may include: a first line and a second line adjacent to each other and bypassing around an edge of the first area; and a third line and a fourth line adjacent to each other and bypassing around an edge of the second area, wherein the first area and the second area are different from each other in at least one of size or shape.

The first line may bypass a first side of the first area, and the second line may bypass around a second side of the first area.

The first line and the second line may extend in opposite directions from a first point, and the first point may be located on a virtual line that passes through a center of the first area.

The third line may bypass around a first side of the second area, and the fourth line may bypass around a second side of the second area.

The third line and the fourth line may extend in opposite directions from a second point, and the second point may be spaced apart from a virtual line that passes through a center of the second area.

The plurality of lines may include data lines or scan lines.

The display panel may further include an intermediate area located between the first and second areas and the display area, wherein the first and second areas are surrounded by the intermediate area.

A width between the first area and the second area in the intermediate area may be greater than a width between the first area and a first end portion of the intermediate area or a width between the second area and an end portion of the intermediate area.

A number of lines between the first area and the second area in the intermediate area may be greater than a sum of a number of lines between a first end portion of the intermediate area and the first area and a number of signal lines between a second portion of the intermediate area and the second area.

The display panel may further include an opening corresponding to at least one of the first area or the second area.

According to one or more embodiments, a display panel includes: a substrate including a first area and a second area that are spaced apart from each other in a first direction, a display area surrounding the first area and the second area, and an intermediate area located between the first and second areas and the display area; a plurality of display elements located in the display area; an encapsulation structure covering the plurality of display elements; and a plurality of lines extending in a direction that intersects the first direction, the plurality of lines being electrically connected to the plurality of display elements, respectively, wherein the first area and the second area are different from each other in at least one of size or shape, and the plurality of lines include lines bypassing around the first area or the second area in the intermediate area.

A number of lines passing between the first area and the second area may be greater than half a sum of numbers of lines passing through the intermediate area.

The plurality of lines may include neighboring lines passing between the first area and the second area, and an interval of the neighboring lines in the intermediate area may be less than an interval of the neighboring lines in the display area.

The bypassing lines may include a first line and a second line that are neighboring each other, wherein the first line extends along an edge of a first side of the first area, and the second line extends along an edge of a second side of the first area.

The first line and the second line may be symmetric about a virtual line that passes through a center of the first area.

A central angle of a bypassing portion of the first line about the center of the first area and a central angle of a bypassing portion of the second line about the center of the first area may be the same.

The bypassing lines may include a third line and a fourth line that are neighboring each other, wherein the third line bypasses a first side of the second area, and the fourth line bypasses a second side of the second area.

The third line and the fourth line may be asymmetric about a virtual line that passes through a center of the second area.

A central angle of a bypassing portion of the third line about the center of the second area and a central angle of a bypassing portion of the fourth line about the center of the second area may be different from each other.

The plurality of lines may include data lines or scan lines.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
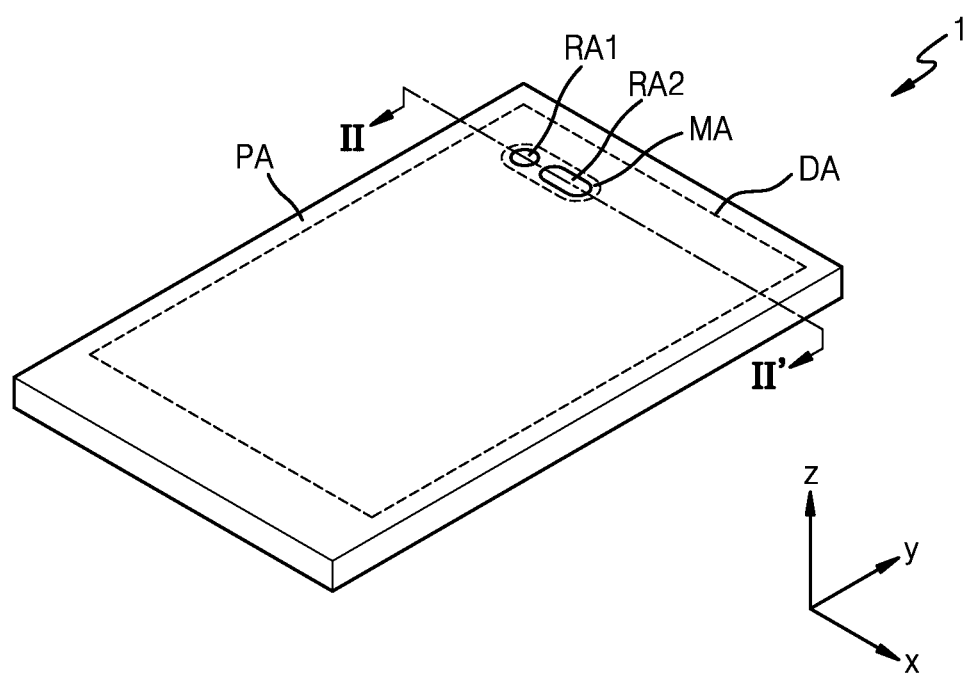
FIG. 1 is a perspective view of a display apparatus according to an embodiment.

The present disclosure may include various embodiments and modifications, and some embodiments thereof will be illustrated in the drawings and will be described herein in detail. The effects and features of the present disclosure and the accompanying methods thereof will become apparent from the following description of the embodiments, taken in conjunction with the accompanying drawings. However, the present disclosure is not limited to the embodiments described below, and may be embodied in various modes.

Reference will now be made in detail to embodiments, examples of which are illustrated in the accompanying drawings. In the drawings, the same elements are denoted by the same reference numerals and a repeated explanation thereof will not be given.

It will be understood that although the terms "first", "second", etc. may be used herein to describe various elements, these elements should not be limited by these terms. These elements are only used to distinguish one element from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on", another layer, region, or element, it may be directly or indirectly formed on the other layer, region, or element. That is, for example, intervening layers, regions, or elements may be present.

Sizes of elements in the drawings may be exaggerated for convenience of explanation. In other words, since sizes and thicknesses of elements in the drawings are arbitrarily illustrated for convenience of explanation, the present disclosure is not limited thereto.

When a certain embodiment may be implemented differently, a specific process order may be different from the described order. For example, two consecutively described processes may be performed substantially at the same time or performed in an order opposite to the described order.

It will be understood that when a layer, region, or element is referred to as being "connected", the layer, the region, or the element may be directly connected or may be indirectly connected with intervening layers, regions, or elements therebetween. For example, when a layer, a region, or an element is electrically connected, the layer, the region, or the element may be directly electrically connected or may be indirectly electrically connected with intervening layers, regions, or elements therebetween.

Throughout the disclosure, the expression "at least one of a, b or c" indicates only a, only b, only c, both a and b, both a and c, both b and c, all of a, b, and c, or variations thereof.

FIG. 1 is a perspective view of a display apparatus 1 according to an embodiment.

Referring to FIG. 1, the display apparatus 1 includes a display area DA surrounding a first area RA1 and a second area RA2. The first area RA1 and the second area RA2 may have different sizes (areas) and/or shapes. For example, the first area RA1 may have a circular shape, and the second area RA2 may have an elliptical shape, or a quadrangular shape with rounded corners. Alternatively, the first area RA1 and the second area RA2 may have similar shapes and different sizes.

The display area DA may provide images by using light emitted from a plurality of pixels located on the display area DA. An intermediate area MA may be located between the first and second areas RA1 and RA2 and the display area DA, and the display area DA may be surrounded by a peripheral area PA. The intermediate area MA and the peripheral area PA may be non-display areas where pixels are not located. The intermediate area MA may be entirely surrounded by the display area DA, and the display area DA may be entirely surrounded by the peripheral area PA.

Although the following is described on the assumption that the display apparatus 1 is an organic light-emitting display apparatus, the display apparatus 1 of the present disclosure is not limited thereto. In another embodiment, the display apparatus 1 of the present disclosure may be any of various display apparatuses such as a liquid display apparatus, an inorganic light-emitting display apparatus (or an inorganic electroluminescent (EL) display apparatus), or a quantum dot light-emitting display apparatus.

Figure 2A:
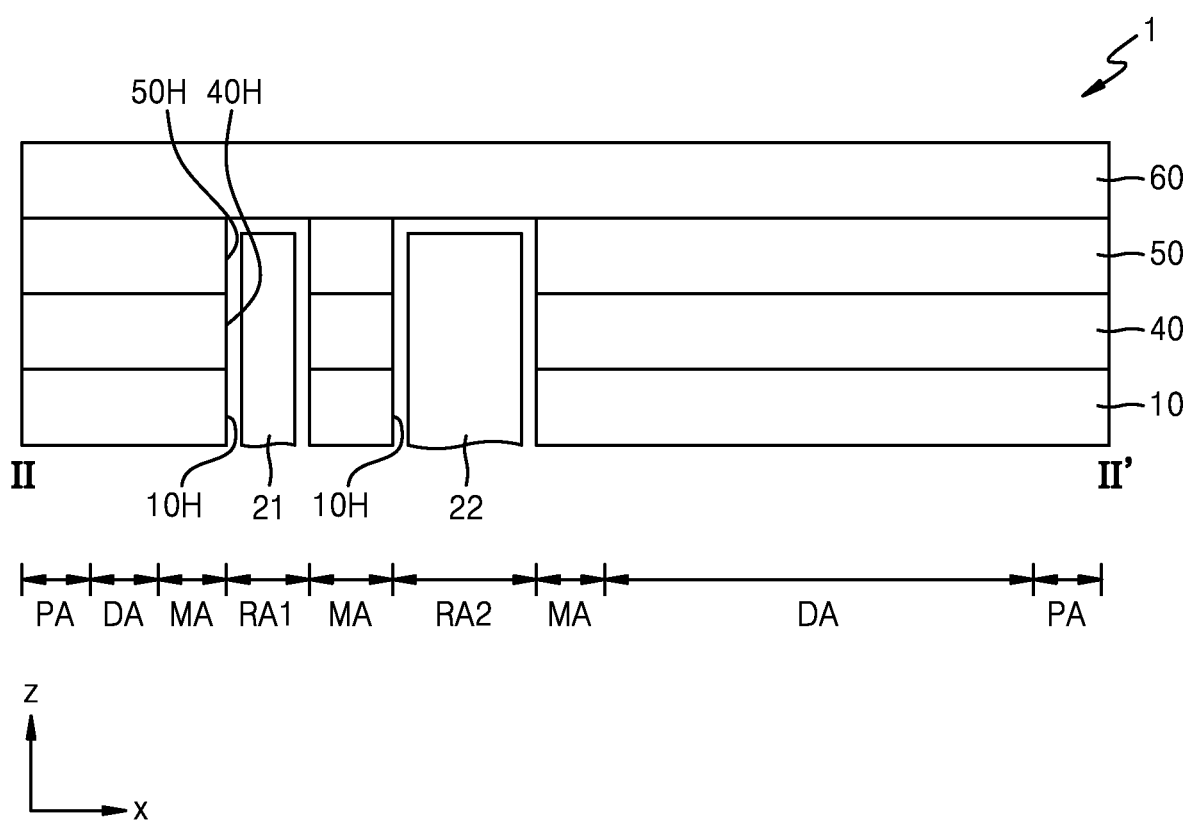
FIGS. 2A, 2B and 2C are cross-sectional views of the display apparatus according to embodiments.
Figure 2B:
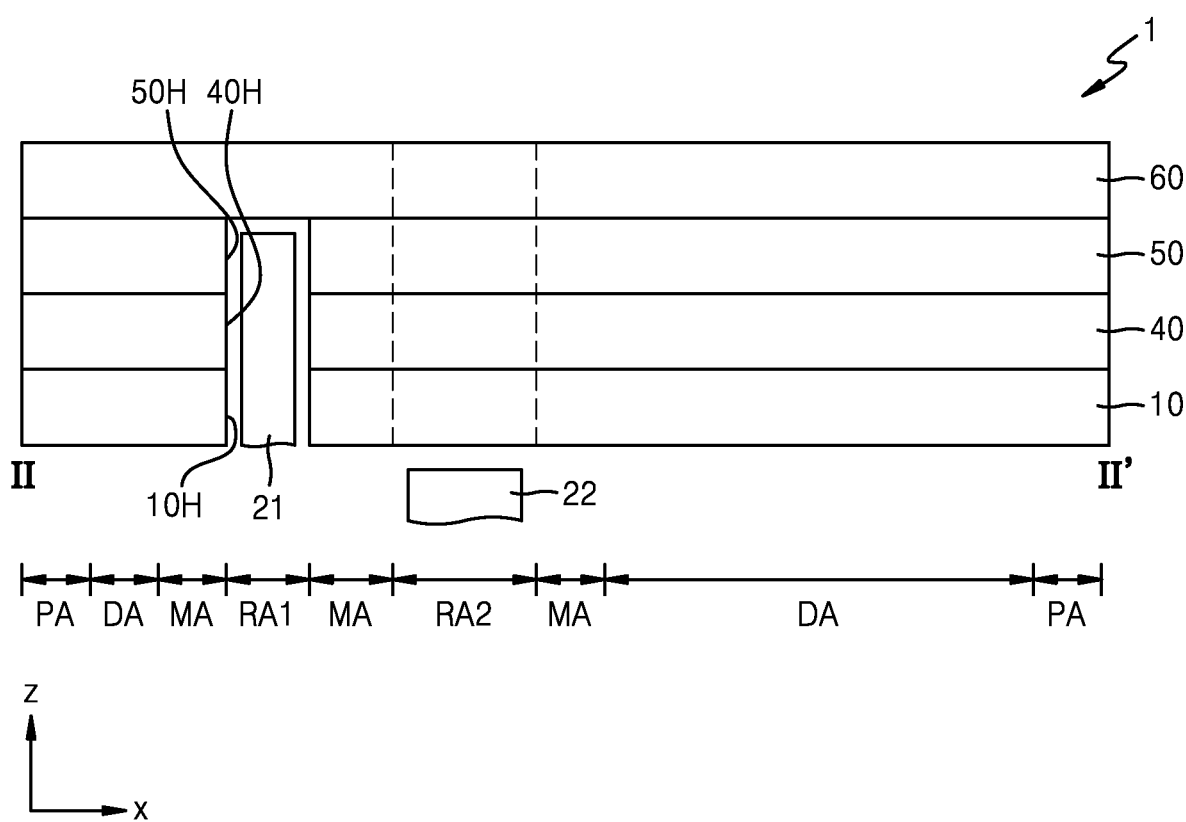
Figure 2C:
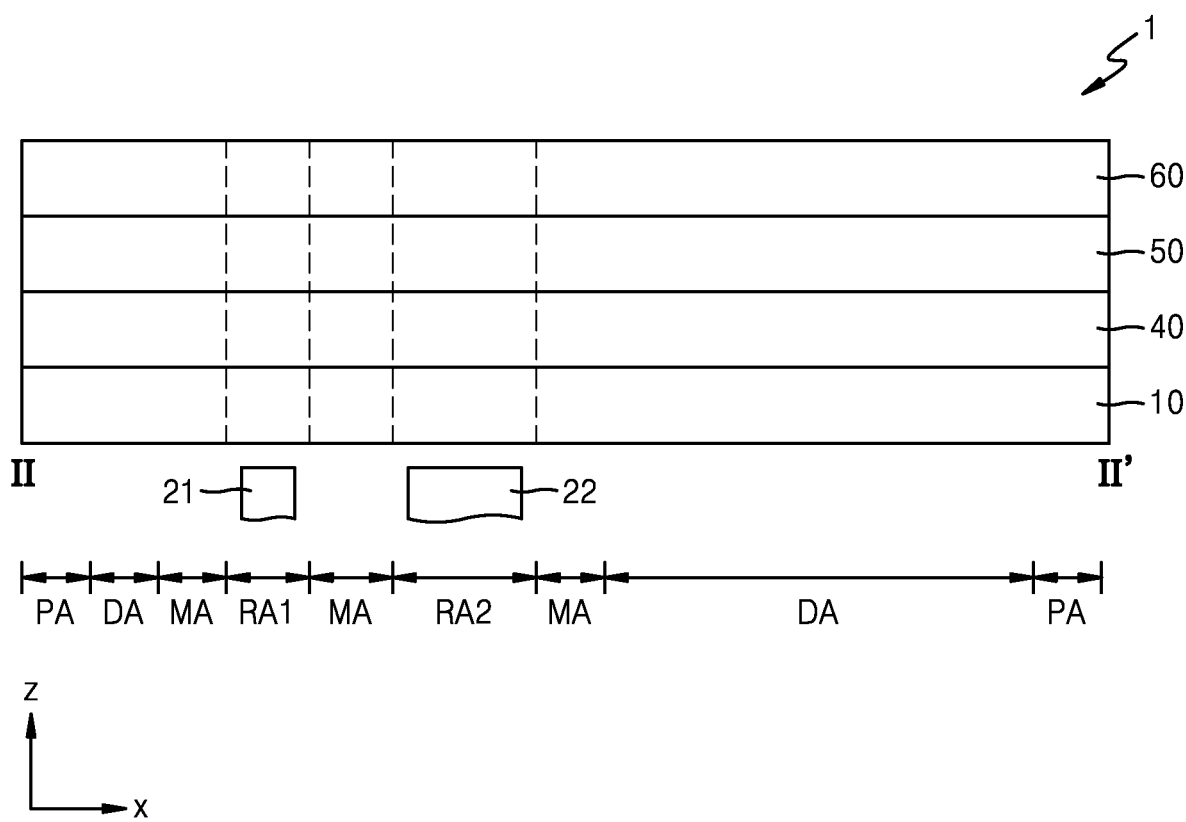

FIGS. 2A through 2C are cross-sectional views taken along line II-II' of the display apparatus 1 of FIG. 1.

Referring to FIG. 2A, the display apparatus 1 may include a display panel 10, an input sensing layer 40 located on the display panel 10, and an optical functional layer 50, and a window. The display panel 10, the input sensing layer 40, and the optical functional layer 50 may be covered by a window 60. The display apparatus 1 may be any of various electronic devices such as a mobile phone, a notebook computer, or a smart watch.

The display panel 10 may display an image. The display panel 10 includes pixels located in the display area DA. Each of the pixels may include a display element and a pixel circuit connected to the display element. The display element may include an organic light-emitting diode (OLED). Alternatively, the display element may include an inorganic light-emitting diode, a liquid crystal layer or a quantum dot light-emitting diode.

The input sensing layer 40 obtains coordinate information according to an external input, for example, a touch event. The input sensing layer 40 may include a sensing electrode (or a touch electrode) and signal lines (e.g., trace lines) connected to the sensing electrode. The input sensing layer 40 may be located on the display panel 10. The input sensing layer 40 may detect an external input by using a mutual capacitance method or/and a self-capacitance method.

The input sensing layer 40 may be directly formed on the display panel 10, or may be separately formed and then coupled to the display panel 10 by using an adhesive layer such as an optical clear adhesive (OCA). For example, the input sensing layer 40 may be continuously formed after a process of forming the display panel 10, and in this case, the adhesive layer may not be located between the input sensing layer 40 and the display panel 10. Although the input sensing layer 40 is located between the display panel 10 and the optical functional layer 50 in FIG. 2A, in another embodiment, the input sensing layer 40 may be located over the optical functional layer 50.

The optical functional layer 50 may include an anti-reflection layer. The anti-reflection layer may reduce a reflectance of light (external light) incident on the display panel 10 through the window 60. The anti-reflection layer may include a retarder and a polarizer. The retarder may be a film type retarder or a liquid crystal coating type retarder, and may include a $\lambda/2$ retarder and/or a $\lambda/4$ retarder. The polarizer may also be a film type polarizer or a liquid crystal coating type polarizer. The film type polarizer may include an elongated synthetic resin film, and the liquid crystal coating type polarizer may include liquid crystals arranged with a predetermined orientation. The retarder and the polarizer may further include a protective film. The retarder and the polarizer or the protective film may be defined as a base layer of the anti-reflection layer.

In another embodiment, the anti-reflection layer may include a black matrix and color filters. The color filters may be arranged in consideration of a color of light emitted from each of the pixels of the display panel 10. In another embodiment, the anti-reflection layer may include a destructive interference structure. The destructive interference structure may include a first reflective layer and a second reflective layer located on different layers. First reflected light and second reflected light respectively reflected by the first reflective layer and the second reflective layer may be destructively interfered, thereby reducing a reflectance of external light.

The optical functional layer 50 may include a lens layer. The lens layer may improve light extraction efficiency of light emitted from the display panel 10 or may reduce color deviation. The lens layer may include a layer having a concave or convex lens shape, or/and may include a plurality of layers having different refractive indices. The optical functional layer 50 may include both the anti-reflection layer and the lens layer, or may include any one of the anti-reflection layer and the lens layer.

Each of the display panel 10, the input sensing layer 40, and the optical functional layer 50 may include openings (or through holes or holes) located in the first and second areas RA1 and RA2. In FIG. 2A, the display panel 10, the input sensing layer 40, and the optical functional layer 50 respectively include first through third openings 10H, 40H, and 50H, and the first through third openings 10H, 40H, and 50H overlap one another. The first through third openings 10H, 40H, and 50H are located to correspond to the first and second areas RA1 and RA2, and the first and second areas RA1 and RA2 may be opening areas. Sizes (or diameters) of the first through third openings 10H, 40H, and 50H may be the same or different from one another. In another embodiment, at least one of the display panel 10, the input sensing layer 40, and/or the optical functional layer 50 may not include openings.

The first opening 10H of the display panel 10 may be located in only one of the first and second areas RA1 and RA2. In FIG. 2B, the display panel 10, the input sensing layer 40, and/or the optical functional layer 50 respectively include the first through third openings 10H, 40H, and 50H located in the first area RA1, and do not include the first through third openings 10H, 40H, and 50H in the second area RA2. In another embodiment, as shown in FIG. 2C, the display panel 10, the input sensing layer 40, and/or the optical functional layer 50 may not include openings in the first and second areas RA1 and RA2.

The first and second areas RA1 and RA2 may be component areas (e.g., a sensor area, a camera area, and a speaker area) where components for adding various functions to the display apparatus 1 are located. First and second components 21 and 22 respectively located in the first and second areas RA1 and RA2 may be located in the first through third openings 10H, 40H, and 50H as shown in FIG.

2A. Alternatively, as shown in FIG. 2B, the first component 21 may be located in the first through third openings 10H, 40H, and 50H, and the second component 22 may be located under the display panel 10. Alternatively, as shown in FIG. 2C, the first and second components 21 and 22 may be located under the display panel 10.

The first and second components 21 and 22 may include electronic components. For example, the first and second components 21 and 22 may be electronic components using light or sound. Examples of the electronic components may include a sensor using light such as an infrared sensor, a camera assembly such as a camera or a lens that receives light and captures an image, a sensor that outputs and detects light or sound to measure a distance or a recognize a fingerprint or the like, a small lamp that outputs light, and a speaker that outputs sound. The electronic component using light may use light of various wavelength bands such as visible light, infrared light, or ultraviolet light. In some embodiments, the first and second areas RA1 and RA2 may be understood as transmission areas through which light or/and sound output to the outside from the first and second components 21 and 22 and/or traveling from the outside toward the electronic components may transmit.

In another embodiment, when the display apparatus 1 is used as an instrument panel (dashboard) of a vehicle or a smart watch, the first and second components 21 and 22 may include a needle such as clock hands or a needle indicating predetermined information (e.g., a vehicle speed). When the display apparatus 1 includes a needle such as clock hands or a needle for a vehicle instrument panel, the needle may pass through the window 60 and may be exposed to the outside, and the window 60 may include an opening. Alternatively, even when the first and second components 21 and 22 include a speaker, the window 60 may include an opening.

The first and second components 21 and 22 may include functional element(s) of the display panel 10 as described above, or may include an element such as an accessory for enhancing the beauty of the display panel 10. Although not shown in FIGS. 2A through 2C, a layer including an OCA may be located between the window 60 and the optical functional layer 50.

The first and second components 21 and 22 may include the same type of electronic components or different types of electronic components. For example, each of the first and second components 21 and 22 may include a camera, and in this case, the display apparatus 1 may provide various applications using a dual camera. Various modifications may be made. For example, one of the first and second components 21 and 22 may include a sensor, and the other of the first and second components 21 and 22 may include a camera. Alternatively, one of the first and second components 21 and 22 may include a lamp, and the other of the first and second components 21 and 22 may include a camera.

Figure 3A:
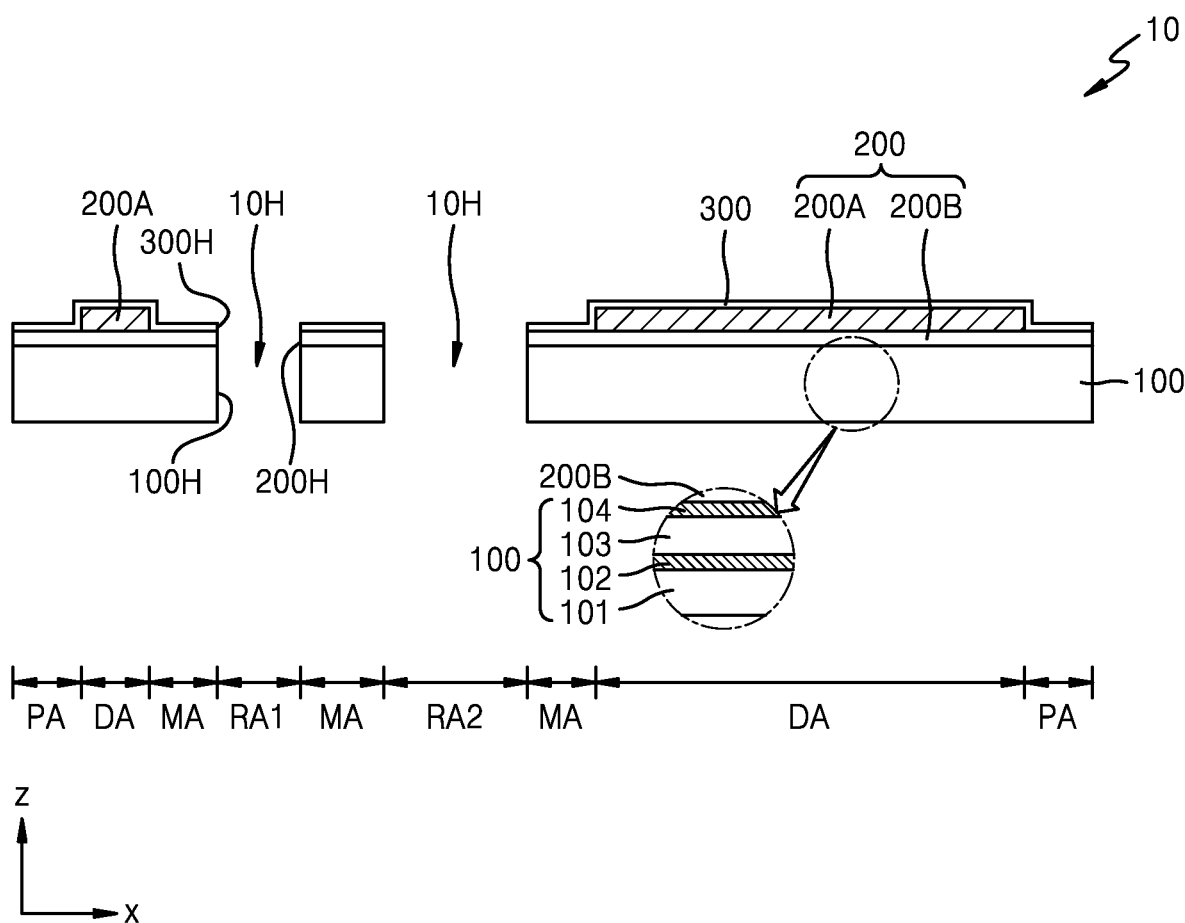
FIGS. 3A, 3B and 3C are cross-sectional views of a display panel according to embodiments.
Figure 3B:
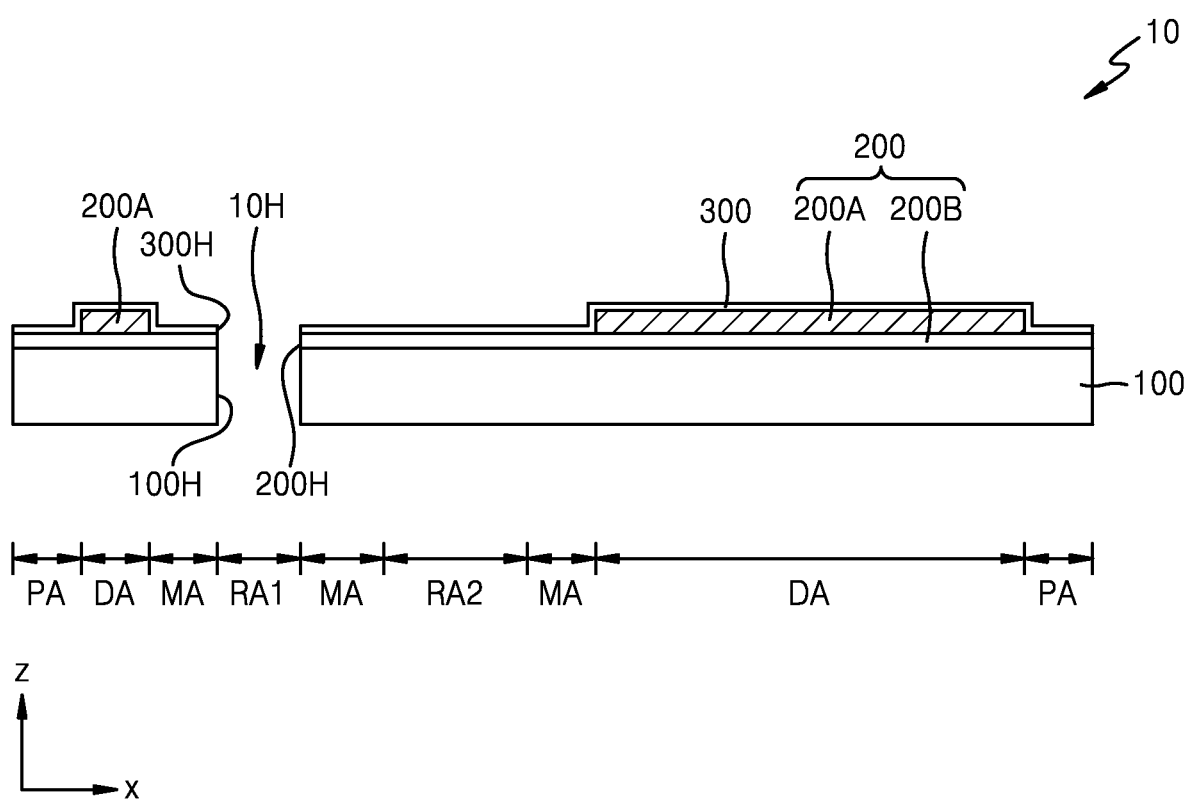
Figure 3C:
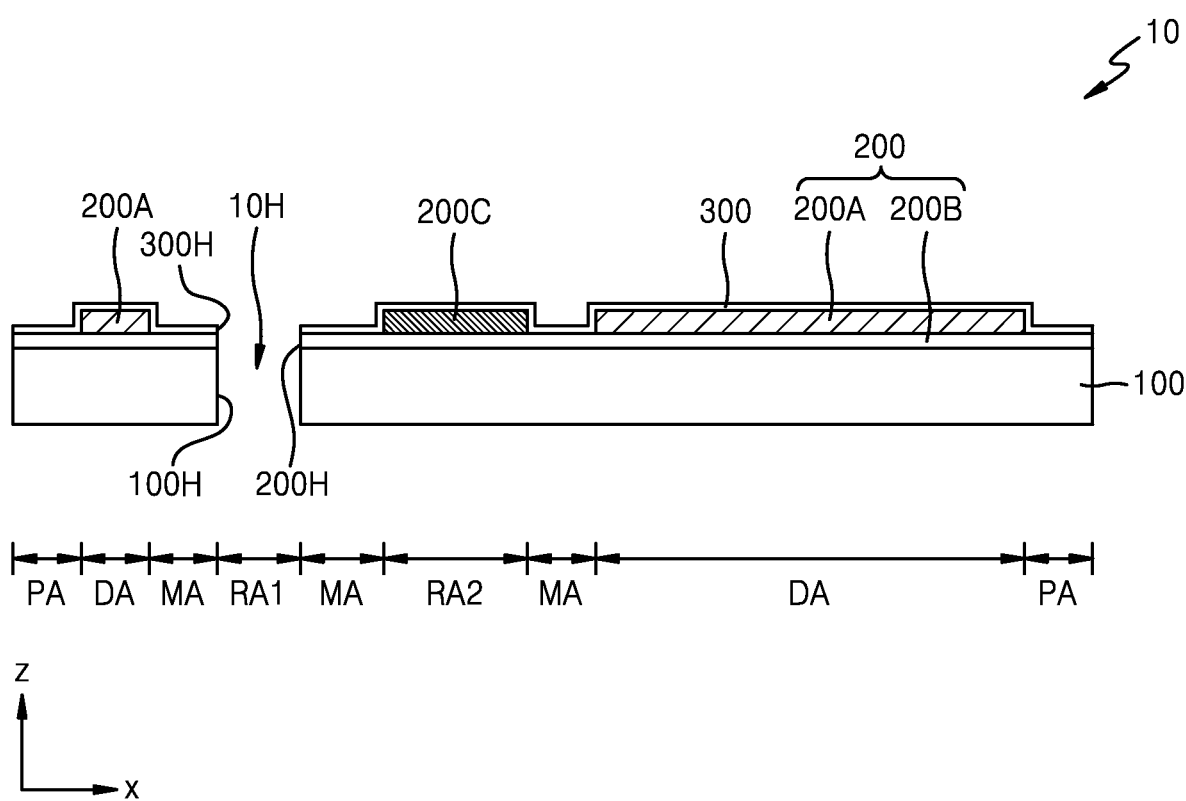

FIGS. 3A through 3C are cross-sectional views of the display panel 10 according to embodiments.

Referring to FIG. 3A, the display panel 10 includes a display layer 200 located on a substrate 100. The substrate 100 may include a glass material or a polymer resin. The substrate 100 may have a multi-layer structure. For example, the substrate 100 may include a first base layer 101, a first barrier layer 102, a second base layer 103, and a second barrier layer 104 as shown in an enlarged view of FIG. 3A.

Each of the first and second base layers 101 and 103 may include a polymer resin. For example, each of the first and second base layers 101 and 103 may include polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose-triacetate (TAC), or cellulose acetate propionate (CAP). The polymer resin may be transparent.

Each of the first and second barrier layers 102 and 104 that is a barrier layer for preventing penetration of external foreign materials may have a single or multi-layer structure including an inorganic material such as silicon nitride (SiNx, x>0) or silicon oxide (SiOx, x>0).

The display layer 200 includes a plurality of pixels. The display layer 200 may include a display element layer 200A including display elements respectively located in pixels and a pixel circuit layer 200B including pixel circuits and insulating layers respectively located in pixels. Each of the pixel circuits may include a thin-film transistor (TFT) and a storage capacitor, and each of the display elements may include an OLED.

The display elements of the display layer 200 may be covered by an encapsulation structure 300 such as a thin-film encapsulation layer, and the thin-film encapsulation layer includes at least one inorganic encapsulation layer and at least one organic encapsulation layer. The inorganic encapsulation layer may include, for example, silicon nitride, silicon oxide, or silicon oxynitride. The organic encapsulation layer may include a polymer-based material. Examples of the polymer-based material may include an acrylic resin, an epoxy-based resin, PI, and polyethylene.

When the display panel 10 includes the substrate 100 having a multi-layer structure and the encapsulation structure 300 that is a thin-film encapsulation layer, the flexibility of the display panel 10 may be improved. The display panel 10 may include the first openings 10H formed through the display panel 10. The first openings 10H may be located in the first and second areas RA1 and RA2. In FIG. 3A, the substrate 100, the display layer 200, and the encapsulation structure 300 that is a thin-film encapsulation layer respectively include through-holes 100H, 200H, and 300H corresponding to the first openings 10H of the display panel 10.

In another embodiment, as shown in FIG. 3B, the first area RA1 may include the first opening 10H, and the second area RA2 may not include opening. In the second area RA2, the first opening 10H may not be formed and no pixel may be located. For example, the display element layer 200A may not be located in the second area RA2. Alternatively, as shown in FIG. 3C, an auxiliary display element layer 200C including sub-pixels may be located in the second area RA2. The auxiliary display element layer 200C may include display elements having a structure or/and an operation method different from those of the display elements of the display element layer 200A. In an embodiment, each pixel of the display element layer 200A may include an active-matrix OLED, and each pixel of the auxiliary display element layer 200C may include a passive-matrix OLED. When the auxiliary display element layer 200C includes display elements of a passive-matrix OLED, elements constituting a pixel circuit may not exist under the display elements. For example, a transistor and a storage capacitor of the pixel circuit layer 200B may not exist under the auxiliary display element layer 200C.

In another embodiment, the auxiliary display element layer 200C may include display elements of the same type (e.g., an active-matrix OLED) as that of the display element layer 200A, and a structure of a pixel circuit that is located under the auxiliary display element layer 200C may be different from that under the display element layer 200A. For example, a pixel circuit (e.g., a pixel circuit including a shield film located between the substrate 100 and a transistor) located under the auxiliary display element layer 200C may have a structure different from that of a pixel circuit located under the display element layer 200A. The display elements of the auxiliary display element layer 200C and the display elements of the display element layer 200A may operate according to different control signals.

A component (e.g., an infrared sensor) that does not require a relatively high transmittance may be located in the second area RA2 where the auxiliary display element layer 200C is located. In this case, the second area RA2 may be understood as a component area and an auxiliary display area. The display element layer 200A and the auxiliary display element layer 200C may be covered by the encapsulation structure 300 that is a thin-film encapsulation layer.

Although a thin-film encapsulation layer is used as the encapsulation structure 300 in FIGS. 3A through 3C, the present disclosure is not limited thereto. The encapsulation structure 300 may have a different structure, as described with reference to FIGS. 4A through 4C.

Figure 4A:
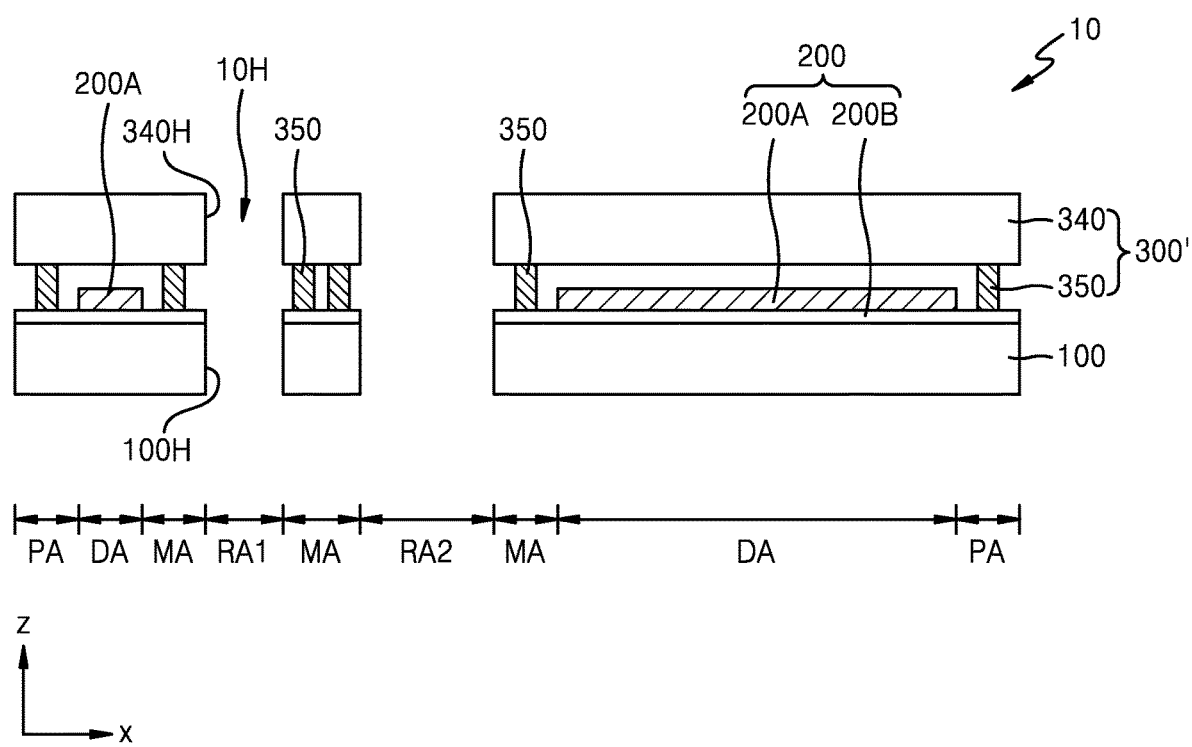
FIGS. 4A, 4B and 4C are cross-sectional views of the display panel according to other embodiments.
Figure 4B:
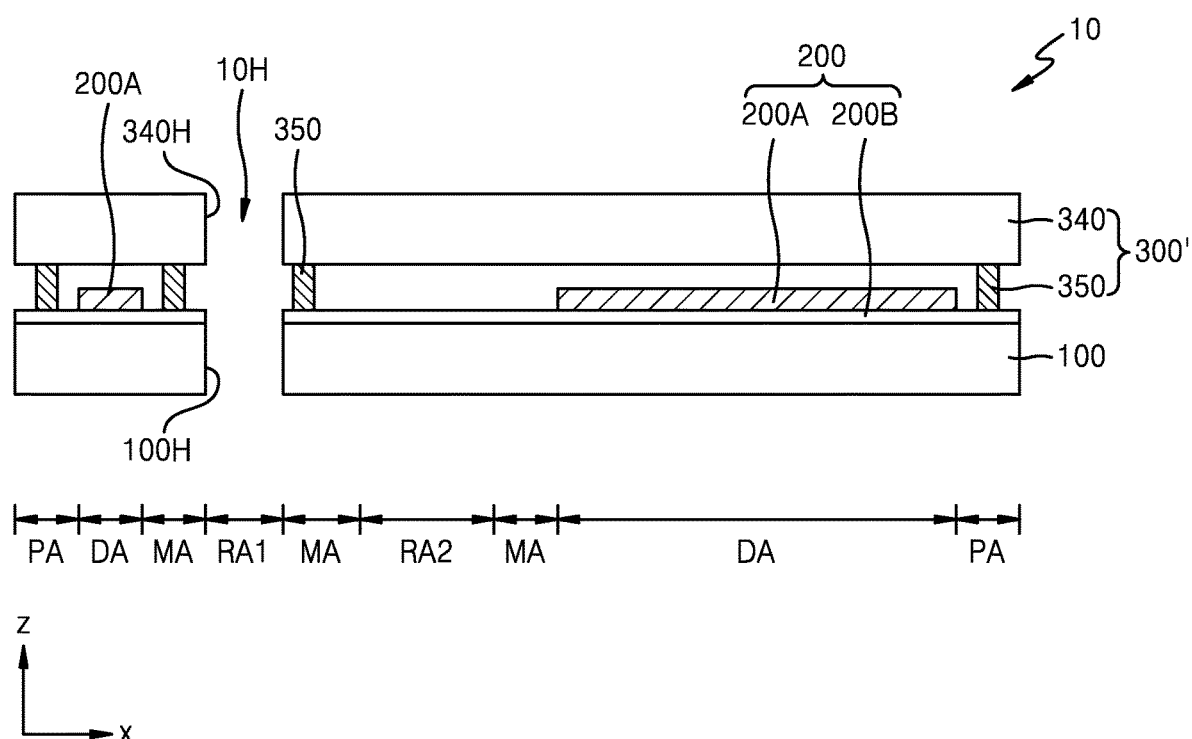
Figure 4C:
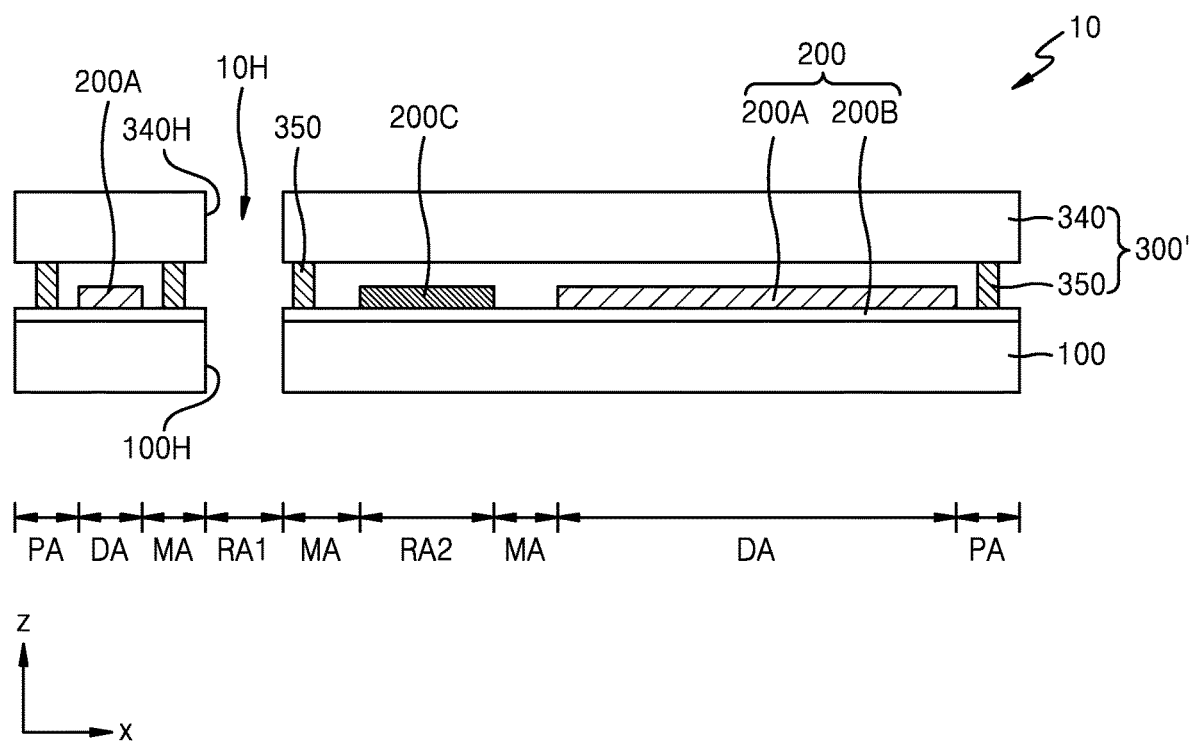

FIGS. 4A through 4C are cross-sectional views of the display panel 10 according to other embodiments.

Referring to FIGS. 4A through 4C, an encapsulation structure 300' includes an encapsulation substrate 340. The encapsulation substrate 340 is disposed on the substrate 100 to face the substrate 100, and the display layer 200 is located between the encapsulation substrate 340 and the substrate 100. Sealants 350 may be located between the encapsulation substrate 340 and the substrate 100, and may surround side surfaces of the display layer 200. For example, in a plan view, the sealants 350 may surround the display layer 200, for example, the display element layer 200A, in the peripheral area PA and the intermediate area MA. Although the sealants 350 of the intermediate area MA are located at both sides of the first opening 10H in FIGS. 4A through 4C in cross-sectional views, the sealants 350 of the intermediate area MA in the plan view may have a closed loop shape completely surrounding the first opening 10H. The sealing structure 350 located in the peripheral area PA and the sealing structure 350 located in the intermediate area MA may be spaced apart from each other.

As shown in FIG. 4A, the first opening 10H may be formed in each of the first and second areas RA1 and RA2, and each of the first openings 10H may be surrounded by the sealant 350. In another embodiment, as shown in FIG. 4B, when the first opening 10H is not formed in the second area RA2, the sealant 350 may surround the first opening 10H corresponding to the first area RA1 in the intermediate area MA. Pixels, for example, the display element layer 200A, may not be located in the second area RA2. In another embodiment, as shown in FIG. 4C, the auxiliary display element layer 200C may be located in the second area RA2. The auxiliary display element layer 200C may include display elements having a structure or/and an operation method different from those of display elements of the display element layer 200A as described above.

Figure 5:
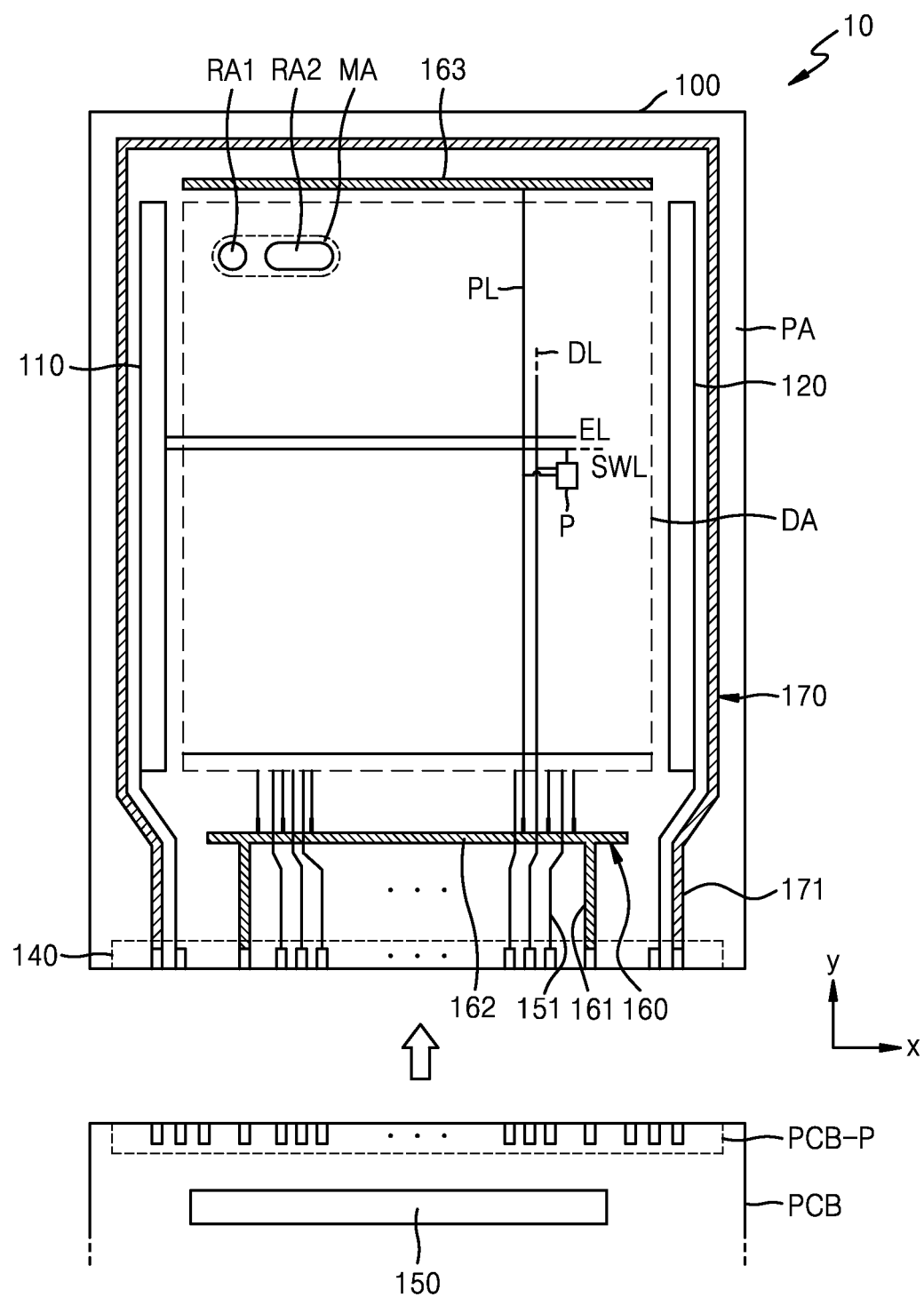
FIG. 5 is a plan view of the display panel according to an embodiment.

FIG. 5 is a plan view of the display panel 10 according to an embodiment.

Referring to FIG. 5, the display panel 10 may include the first and second areas RA1 and RA2, the display area DA, the intermediate area MA, and the peripheral area PA. FIG. 5 may illustrate the substrate 100 of the display panel 10. For example, the substrate 100 may include the first and second areas RA1 and RA2, the display area DA, the intermediate area MA, and the peripheral area PA.

The display panel 10 includes a plurality of pixels P located in the display area DA. Each of the pixels P may include a display element such as an OLED. Each pixel P may emit light, for example, one of red, green, blue, or white light, through the OLED. The term 'pixel' used herein may refer to a pixel that emits one of red, green, blue, or white light as described above. The first and second areas RA1 and RA2 are located inside the display area DA, and the intermediate area MA is located between the first and second areas RA1 and RA2 and the display area DA.

The intermediate area MA may surround the first and second areas RA1 and RA2. The peripheral area PA may surround the display area DA. The first and second areas RA1 and RA2, the intermediate area MA and the peripheral area PA are non-display areas where a display element such as an OLED that emits light is not located. Signal lines or/and power lines that apply signals to the pixels P may be located in the intermediate area MA and the peripheral area PA.

A first driving circuit 110, a second driving circuit 120, a terminal 140, a data driving circuit 150, a first power supply line 160, and a second power supply line 170 may be located in the peripheral area PA.

The first driving circuit 110 may include a scan driving circuit and control driving circuit. The first driving circuit 110 may apply a scan signal and an emission control signal to each pixel P respectively through a scan line SWL and an emission control line EL. The second driving circuit 120 may include a scan driving circuit and control driving circuit. The second driving circuit 120 may be located opposite to the first driving circuit 110 with the display area DA disposed therebetween. The second driving circuit 120 may apply a scan signal and an emission control signal to each pixel P respectively through the scan line SWL and the emission control line EL, like the first driving circuit 110.

The terminal 140 may be located at one side of the display area DA in the peripheral area PA. The terminal 140 may be exposed without being covered by an insulating layer and may be electrically connected to a printed circuit board (PCB). A terminal PCB-P of the PCB may be electrically connected to the terminal 140 of the display panel 10. The PCB transmits power or a control signal from a controller to the display panel 10. A control signal generated by the controller may be transmitted to the first and second driving circuits 110 and 120 through the PCB. The controller may respectively supply first and second power (e.g., ELVDD and ELVSS in FIG. 6) to the first and second power supply lines 160 and 170 through first and second connection wirings 161 and 171. The first power (e.g., ELVDD) may be supplied to each pixel P through a driving voltage line PL connected to the first power supply line 160, and the second power (e.g., ELVSS) may be supplied to a counter electrode of the pixel P connected to the second power supply line 170.

The data driving circuit 150 is electrically connected to a data line DL through pads in the terminal PCB-P and pads in the terminal 140. A data signal of the data driving circuit 150 may be applied to each pixel P through the data line DL connected to the connection wiring 151 and the connection wiring 151 connected to the terminal 140. Although the data driving circuit 150 is located on the PCB in FIG. 5, in another embodiment, the data driving circuit 150 may be located on the substrate 100. For example, the data driving circuit 150 may be located between the terminal 140 and the first power supply line 160 in a plan view.

The first power supply line 160 may include a first sub-wiring 162 and a second sub-wiring 163 that extend in an x-direction to be parallel to each other with the display area DA disposed therebetween. The second power supply line 170 may have a loop shape with an open side, and may partially surround the display area DA.

Figure 6:
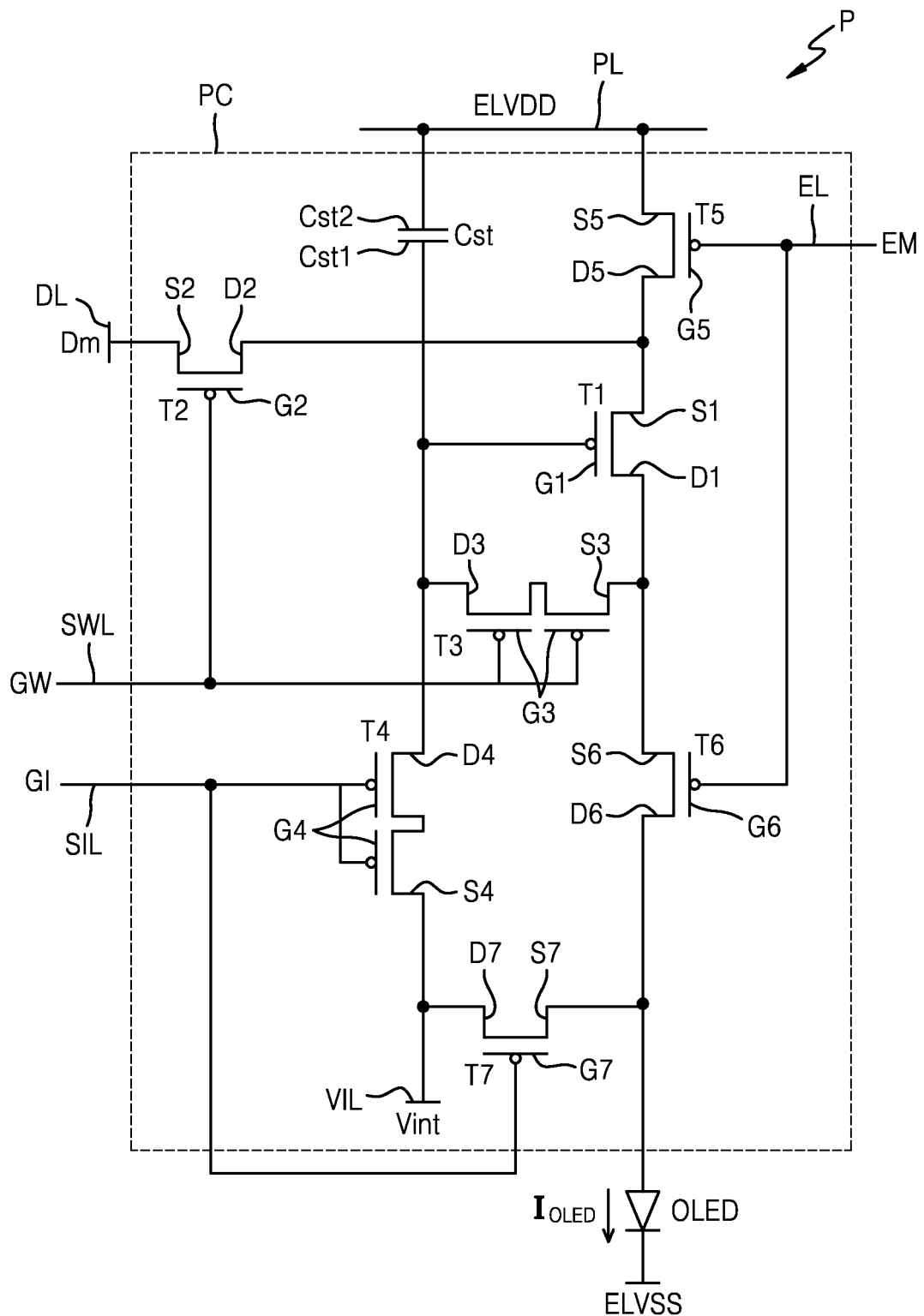
FIG. 6 is an equivalent circuit diagram illustrating a pixel of the display panel according to an embodiment.

FIG. 6 is an equivalent circuit diagram illustrating a pixel of the display panel 10 according to an embodiment.

Referring to FIG. 6, each pixel P includes a pixel circuit PC and an OLED connected to the pixel circuit PC. The pixel circuit PC may include a plurality of TFTs and a storage capacitor. The TFTs and the storage capacitor may be connected to signal lines (e.g., a scan line SWL, a previous scan line SIL, an emission control line EL, and a data line DL), an initialization voltage line VIL, and a driving voltage line PL.

Although each pixel P is connected to the signal lines (e.g., SWL, SIL, EL, and DL), the initialization voltage line VIL, and the driving voltage line PL in FIG. 6, the present disclosure is not limited thereto. In another embodiment, at least one of the signal lines (e.g., SWL, SIL, EL, and DL), the initialization voltage line VIL, and the driving voltage line PL may be shared by neighboring pixels.

The plurality of TFTs may include a driving TFT T1, a switching TFT T2, a compensation TFT T3, a first initialization TFT T4, an operation control TFT T5, an emission control TFT T6, and a second initialization TFT T7.

The signal lines include the scan line SWL that transmits a scan signal GW, the previous scan line SIL that transmits a previous scan signal GI to the first initialization TFT T4 and the second initialization TFT T7, the emission control line EL that transmits an emission control signal EM to the operation control TFT T5 and the emission control TFT T6, and the data line DL that intersects the scan line SWL and transmits a data signal Dm. The driving voltage line PL transmits a driving voltage ELVDD to the driving TFT T1, and the initialization voltage line VIL transmits an initialization voltage Vint that initializes the driving TFT T1 and a pixel electrode.

A driving gate electrode G1 of the driving TFT T1 is connected to a first storage capacitor electrode Cst1 of a storage capacitor Cst, a driving source electrode S1 of the driving TFT T1 is connected to the driving voltage line PL via the operation control TFT T5, and a driving drain electrode D1 of the driving TFT T1 is electrically connected to the pixel electrode of the OLED via the emission control TFT T6. The driving TFT T1 receives the data signal Dm according to a switching operation of the switching TFT T2 and supplies driving current $I_{OLED}$ to the OLED.

A switching gate electrode G2 of the switching TFT T2 is connected to the scan line SWL, a switching source electrode S2 of the switching TFT T2 is connected to the data line DL, and a switching drain electrode D2 of the switching TFT T2 is connected to the driving source electrode S1 of the driving TFT T1 and is connected to the driving voltage line PL via the operation control TFT T5. The switching TFT T2 is turned on in response to the scan signal GW received through the scan line SWL and performs a switching operation of transmitting the data signal Dm received through the data line DL to the driving source electrode S1 of the driving TFT T1.

A compensation gate electrode G3 of the compensation TFT T3 is connected to the scan line SWL, a compensation source electrode S3 of the compensation TFT T3 is connected to the driving drain electrode D1 of the driving TFT T1 and is connected to the pixel electrode of the OLED via the emission control TFT T6, and a compensation drain electrode D3 of the compensation TFT T3 is connected to the first storage capacitor electrode Cst1 of the storage capacitor Cst, a first initialization drain electrode D4 of the first initialization TFT T4, and the driving gate electrode G1 of the driving TFT T1. The compensation TFT T3 is turned on according to the scan signal GW received through the scan line SWL, and diode-connects the driving TFT T1 by electrically connecting the driving gate electrode G1 and the driving drain electrode D1 of the driving TFT T1.

A first initialization gate electrode G4 of the first initialization TFT T4 is connected to the previous scan line SIL, a first initialization source electrode S4 of the first initialization TFT T4 is connected to a second initialization drain electrode D7 of the second initialization TFT T7 and the initialization voltage line VIL, and the first initialization drain electrode D4 of the first initialization TFT T4 is connected to the first storage capacitor electrode Cst1 of the storage capacitor Cst, the compensation drain electrode D3 of the compensation TFT T3, and the driving gate electrode G1 of the driving TFT T1. The first initialization TFT T4 is turned on in response to the previous scan signal GI received through the previous scan line SIL and performs an initialization operation of initializing a voltage of the driving gate electrode G1 of the driving TFT T1 by transmitting the initialization voltage Vint to the driving gate electrode G1 of the driving TFT T1.

An operation control gate electrode G5 of the operation control TFT T5 is connected to the emission control line EL, an operation control source electrode S5 of the operation control TFT T5 is connected to the driving voltage line PL, and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line EL, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to a second initialization source electrode S7 of the second initialization TFT T7 and the pixel electrode of the OLED.

The operation control TFT T5 and the emission control TFT T6 are simultaneously turned on in response to the emission control signal EM received through the emission control line EL, so that the driving voltage ELVDD is transmitted to the OLED and the driving current $I_{OLED}$ flows through the OLED.

A second initialization gate electrode G7 of the second initialization TFT T7 is connected to the previous scan line SIL, the second initialization source electrode S7 of the second initialization TFT T7 is connected to the emission control drain electrode D6 of the emission control TFT T6 and the pixel electrode of the OLED, and the second initialization drain electrode D7 of the second initialization TFT T7 is connected to the first initialization source electrode S4 of the first initialization TFT T4 and the initialization voltage line VIL. The second initialization TFT T7 is turned on according to the previous scan signal GI received through the previous scan line SIL and initializes the pixel electrode of the OLED.

Although the first initialization TFT T4 and the second initialization TFT T7 are connected to the previous scan line SIL in FIG. 6, the present disclosure is not limited thereto. In another embodiment, the first initialization TFT T4 may be connected to the previous scan line SIL and may be driven in response to the previous scan signal GI, and the second initialization TFT T7 may be connected to an additional signal line (e.g., a next scan line) and may be driven in response to a signal transmitted to the additional signal line.

A second storage capacitor electrode Cst2 of the storage capacitor Cst is connected to the driving voltage line PL, and a counter electrode of the OLED is connected to a common voltage ELVSS. Accordingly, the OLED receives the driving current $I_{OLED}$ from the driving TFT T1 and emits light to display an image.

Although the compensation TFT T3 and the first initialization TFT T4 have a dual gate electrode structure in FIG. 6, the compensation TFT T3 and the first initialization TFT T4 may have one single electrode.

Although the pixel circuit PC includes seven TFTs and one storage capacitor in FIG. 6, the present disclosure is not limited thereto and various modifications may be made. For example, the number of TFTs and storage capacitors may be equal to or less than 6 or equal to or greater than 8. The following will be described on the assumption that the pixel circuit PC is the pixel circuit PC in FIG. 6 for convenience of explanation.

Figure 7A:
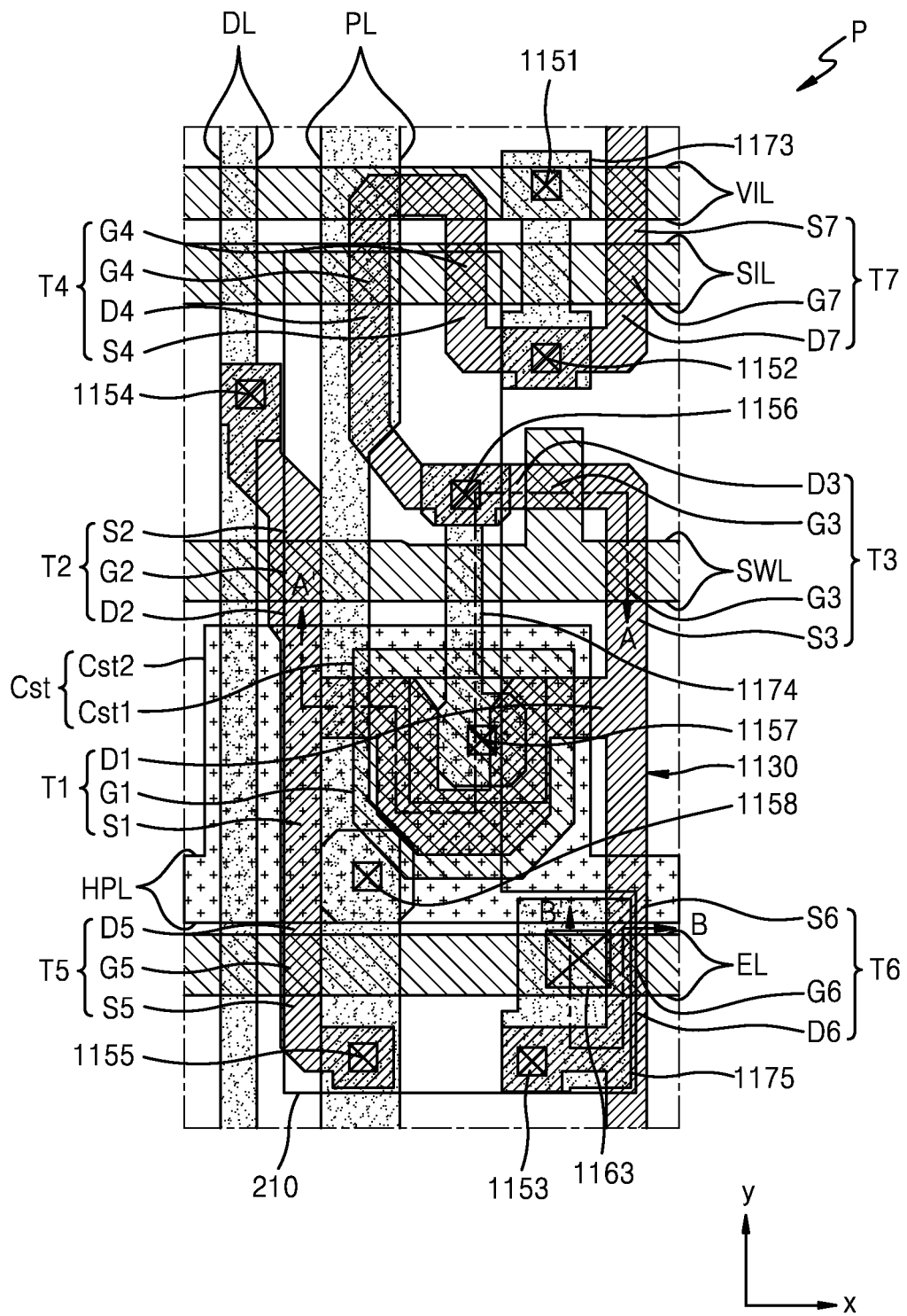
FIG. 7A is a plan view illustrating a pixel of the display panel according to an embodiment.
Figure 7B:
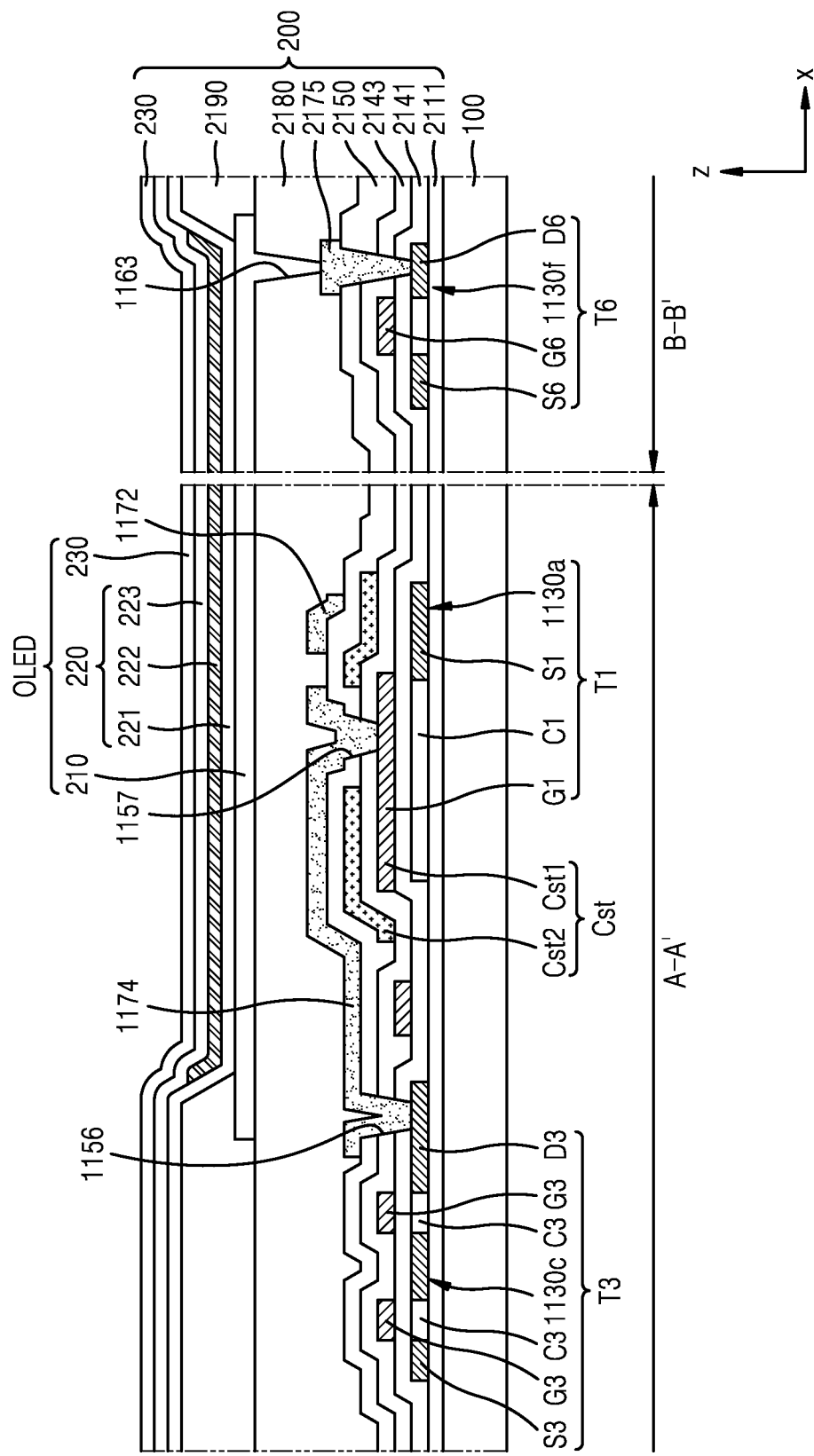
FIG. 7B is a cross-sectional view taken along lines A-A' and B-B' of FIG. 7A.

FIG. 7A is a plan view illustrating a pixel of the display panel 10 according to an embodiment. FIG. 7B is a cross-sectional view taken along lines A-A' and B-B' of FIG. 7A.

Referring to FIGS. 7A and 7B, the driving TFT T1, the switching TFT T2, the compensation TFT T3, the first initialization TFT T4, the operation control TFT T5, the emission control TFT T6, and the second initialization TFT T7 are arranged along a semiconductor layer 1130. The semiconductor layer 1130 is located on the substrate 100. In this regard, in FIG. 7B, portions 1130a, 1130c and 1130f of the semiconductor layer 1130 are located on the substrate 100. A buffer layer 2111 including an inorganic material such as silicon oxide, silicon nitride, or silicon oxynitride is formed between the substrate 100 and the semiconductor layer 1130.

Some portions of the semiconductor layer 1130 correspond to semiconductor layers of the driving TFT T1, the switching TFT T2, the compensation TFT T3, the first initialization TFT T4, the operation control TFT T5, the emission control TFT T6, and the second initialization TFT T7. In other words, the semiconductor layers of the driving TFT T1, the switching TFT T2, the compensation TFT T3, the first initialization TFT T4, the operation control TFT T5, the emission control TFT T6, and the second initialization TFT T7 may be connected to one another and may be formed in various shapes. FIG. 7B illustrates a driving semiconductor layer 1130a of the driving TFT T1, a compensation semiconductor layer 1130c of the compensation TFT T3, and an emission control semiconductor layer 1130f of the emission control TFT T6 corresponding to some portions of the semiconductor layer 1130.

The semiconductor layer 1130 includes a channel region and a source region and a drain region located at both sides of the channel region. The source region and the drain region may be understood as a source electrode and a drain electrode of a corresponding TFT. For convenience, the source region and the drain region are respectively referred to as a source electrode and a drain electrode.

The driving TFT T1 includes the driving gate electrode G1 overlapping a driving channel region, and the driving source electrode S1 and the driving drain electrode D1 located at both sides of the driving channel region. The driving channel region overlapping the driving gate electrode G1 may have a bent shape such as a capital Greek letter omega shape to form a long channel width in a narrow space. When the driving channel region has a long channel width, a driving capability of the driving TFT T1 may be increased, thus a gray scale of light emitted by the OLED may be more finely controlled, and display quality may be improved.

The switching TFT T2 includes the switching gate electrode G2 overlapping a switching channel region, and the switching source electrode S2 and the switching drain electrode D2 located at both sides of the switching channel region. The switching drain electrode D2 may be connected to the driving source electrode S1.

The compensation TFT T3 may have a dual TFT structure. The compensation TFT T3 may include the compensation gate electrodes G3 overlapping two compensation channel regions, and may include the compensation source electrode S3 and the compensation drain electrode D3 located at both sides of the compensation gate electrodes G3. The compensation TFT T3 may be connected to the driving gate electrode G1 of the driving TFT T1 through a node connection line 1174 as described below.

The first initialization TFT T4 having a dual TFT structure may include the first initialization gate electrodes G4 overlapping two first initialization channel regions, and may include the first initialization source electrode S4 and the first initialization drain electrode D4 located at both sides of the first initialization gate electrodes G4.

The operation control TFT T5 may include the operation control gate electrode G5 overlapping an operation control channel region, and the operation control source electrode S5 and the operation control drain electrode D5 located at both sides of the operation control gate electrode G5. The operation control drain electrode D5 may be connected to the driving source electrode S1.

The emission control TFT T6 may include the emission control gate electrode G6 overlapping an emission control channel region, and the emission control source electrode S6 and the emission control drain electrode D6 located at both sides of the emission control gate electrode G6. The emission control source electrode S6 may be connected to the driving drain electrode D1.

The second initialization TFT T7 may include the second initialization gate electrode G7 overlapping a second initialization channel region, and the second initialization source electrode S7 and the second initialization drain electrode D7 located at both sides of the second initialization gate electrode G7.

The above TFTs may be connected to the signal lines (e.g., SWL, SIL, EL, and DL), the initialization voltage line VIL, and the driving voltage line PL.

A gate insulating layer 2141 (see FIG. 7B) may be located on the semiconductor layer 1130, and the scan line SWL, the previous scan line SIL, the emission control line EL, the driving gate electrode G1, and the initialization voltage line VIL may be located on the gate insulating layer 2141. The gate insulating layer 2141 may include an inorganic material such as silicon oxide, silicon nitride, or silicon oxynitride. Each of the scan line SWL, the previous scan line SIL, the emission control line EL, the driving gate electrode G1, and the initialization voltage line VIL may include a metal such as molybdenum (Mo), aluminum (Al), copper (Cu), titanium (Ti), or an alloy thereof.

The scan line SWL may extend in an x-direction. Some portions of the scan line SWL may correspond to the switching and compensation gate electrodes G2 and G3. For example, portions of the scan line SWL overlapping channel regions of the switching and compensation TFTs T2 and T3 may be respectively the switching and compensation gate electrodes G2 and G3.

The previous scan line SIL may extend in the x-direction, and some portions of the previous can line SIL may correspond to the first and second initialization gate electrodes G4 and G7. For example, portions of the previous scan line SIL overlapping channel regions of the first and second initialization driving TFTs T4 and T7 may be respectively the first and second initialization gate electrodes G4 and G7.

The emission control line EL extends in the x-direction. Some portions of the emission control line EL may correspond to the operation control and emission control gate electrodes G5 and G6. For example, portions of the emission control line EL overlapping channel regions of the operation control and emission control driving TFTs T6 and T7 may be respectively the operation control and emission control gate electrodes G5 and G6.

The driving gate electrode G1 may have an island shape, and may be connected to the compensation TFT T3 through the node connection line 1174.

The initialization voltage line VIL extends in the x-direction. The initialization voltage line VIL may be connected to the first and second initialization driving TFTs T4 and T7 through an initialization connection line 1173 as described below.

Although the initialization voltage line VIL is located on a first interlayer insulating layer 2143 in FIG. 7B, in another embodiment, the initialization voltage line VIL may be located on a planarization insulating layer 2180 (see FIG. 7B) and may include the same material as that of a pixel electrode 210.

An electrode voltage line HPL may be located on the scan line SWL, the previous scan line SIL, the emission control line EL, the driving gate electrode G1, and the initialization voltage line VIL with the first interlayer insulating layer 2143 (see FIG. 7B) including an inorganic material therebetween.

The electrode voltage line HPL may extend in the x-direction to intersect the data line DL and the driving voltage line PL as shown in FIG. 7A. A part of the electrode voltage line HPL may cover at least a part of the driving gate electrode G1, and may form the storage capacitor Cst along with the driving gate electrode G1. For example, the driving gate electrode G1 may be the first storage capacitor electrode Cst1 of the storage capacitor Cst, and a part of the electrode voltage line HPL may be the second storage capacitor electrode Cst2 of the storage capacitor Cst.

The driving voltage line PL and the second storage capacitor electrode Cst2 are electrically connected to the driving voltage line PL. In FIG. 7A, the electrode voltage line HPL is connected to the driving voltage line PL located on the electrode voltage line HPL through a contact hole 1158. The electrode voltage line HPL and the driving voltage line PL may have the same voltage level (e.g., a constant voltage). The electrode voltage line HPL may be understood as a horizontal driving voltage line.

Since the driving voltage line PL extends in a y-direction and the electrode voltage line HPL electrically connected to the driving voltage line PL extends in the x-direction intersecting the y-direction, a plurality of the driving voltage lines PL and a plurality of the electrode voltage lines HPL may form a mesh structure in a display area.

The data line DL, the driving voltage line PL, the initialization connection line 1173, and the node connection line 1174 may be located on the second storage capacitor electrode Cst2 and the electrode voltage line HPL with a second interlayer insulating layer 2150 (see FIG. 7B) including an inorganic material therebetween. Each of the data line DL, the driving voltage line PL, the initialization connection line 1173, and the node connection line 1174 may include aluminum (Al), copper (Cu), or titanium (Ti), and may have a single or multi-layer structure. In an embodiment, each of the driving voltage line PL and the data line DL may have a multi-layer structure formed of Ti/Al/Ti.

The data line DL may extend in the y-direction, and may be connected to the switching source electrode S2 of the switching TFT T2 through a contact hole 1154. A part of the data line DL may be understood as a switching source electrode.

The driving voltage line PL extends in the y-direction, and is connected to the electrode voltage line HPL through the contact hole 1158 as described above. Also, the driving voltage line PL may be connected to the operation control TFT T5 through a contact hole 1155. The driving voltage line PL may be connected to the operation control drain electrode D5 through the contact hole 1155.

One end of the initialization connection line 1173 may be connected to the first and second initialization TFTs T4 and T7 through a contact hole 1152, and the other end of the initialization connection line 1173 may be connected to the initialization voltage line VIL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

The planarization insulating layer 2180 including an organic insulating material is located on the data line DL, the driving voltage line PL, the initialization connection line 1173, and the node connection line 1174, and the pixel electrode 210 is located on the planarization insulating layer 2180.

Referring to FIGS. 7A and 7B, an end of the pixel electrode 210 may be covered by a pixel-defining film 2190 on the planarization insulating layer 2180, and a central portion of the pixel electrode 210 may be exposed through an opening of the pixel-defining film 2190. The pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 210 may further include a film formed of ITO, IZO, ZnO, or $In_2O_3$ located over or under the reflective film. An intermediate layer 220 is located on the pixel electrode 210 that is exposed through the opening.

The intermediate layer 220 includes an emission layer 222 on the pixel electrode 210 exposed through the opening of the pixel-defining film 2190. The emission layer 222 may include a high molecular weight organic material or a low molecular weight organic material that emits light of a predetermined color. In an embodiment, the intermediate layer 220 may include a first functional layer 221 located under the emission layer 222 and/or a second functional layer 223 located over the emission layer 222 as shown in FIG. 7B.

The first functional layer 221 may have a single or multi-layer structure. For example, when the first functional layer 221 is formed of a high molecular weight material, the first functional layer 221 that is a hole transport layer (HTL) having a single-layer structure may be formed of poly(3,4-ethylenedioxythiophene) (PEDOT) or polyaniline (PANI). When the first functional layer 221 is formed of a low molecular weight material, the first functional layer 221 may include a hole injection layer (HIL) and a hole transport layer (HTL).

The second functional layer 223 is optional. For example, when each of the first functional layer 221 and the emission layer 222 is formed of a high molecular weight material, in order to improve the characteristics of the OLED, it is preferable to form the second functional layer 223. The second functional layer 223 may have a single or multi-layer structure. The second functional layer 223 may include an electron transport layer (ETL) and/or an electron injection layer (EIL).

A counter electrode 230 faces the pixel electrode 210 with the intermediate layer 220 disposed therebetween. The counter electrode 230 may be formed of a conductive material having a low work function. For example, the counter electrode 230 may include a (semi) transparent layer including Ag, Mg, Al, Pt, Pd, Au, Ni, Nd, Ir, Cr, lithium (Li), calcium (Ca), or an alloy thereof. Alternatively, the counter electrode 230 may further include a layer formed of ITO, IZO, ZnO, or $In_2O_3$ located on the (semi) transparent layer including the above material.

Layers of the display layer 200, for example, layers from the buffer layer 2111 to the counter electrode 230, described with reference to FIG. 7B may be covered by a thin-film encapsulation layer or an encapsulation substrate of FIGS. 3A through 4C.

Figure 8:
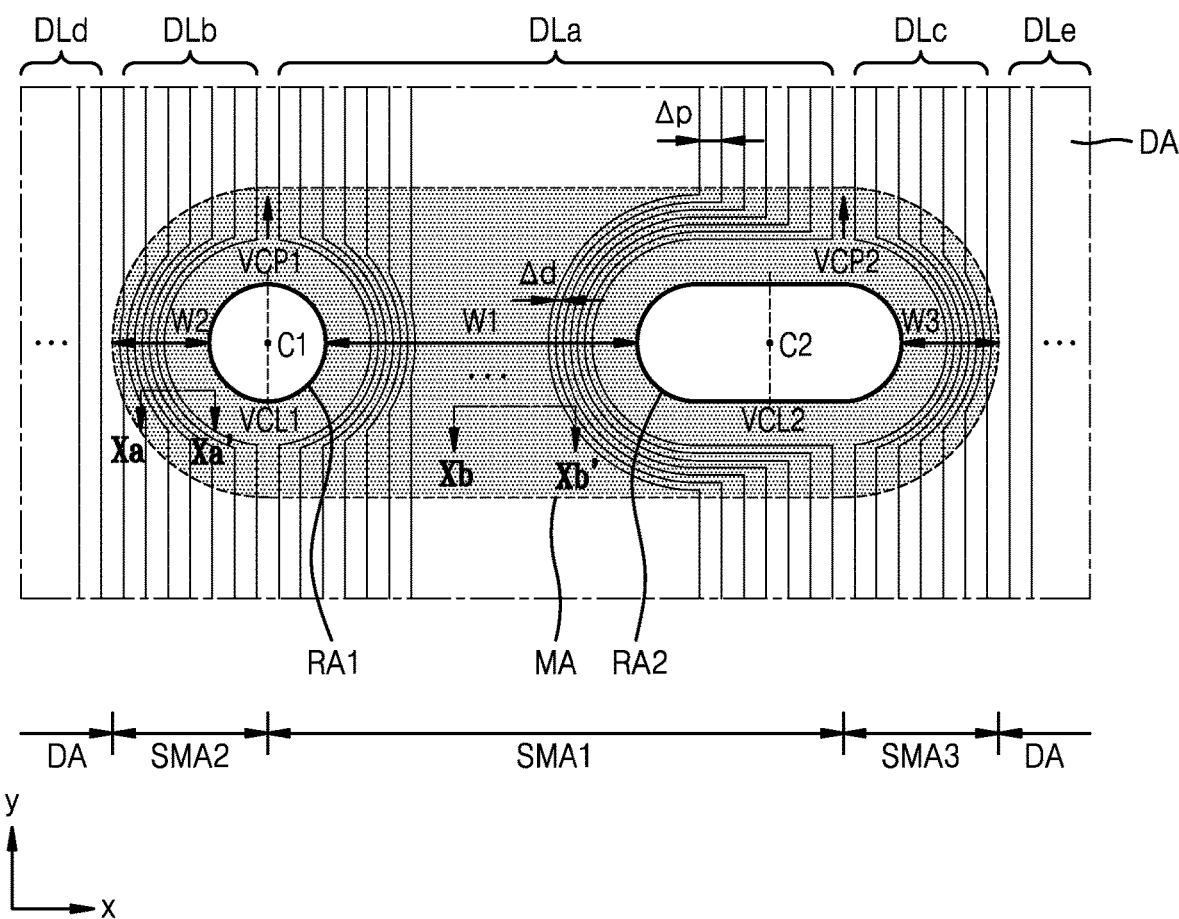
FIG. 8 is a plan view illustrating first lines located in an intermediate area of the display panel according to an embodiment.

FIG. 8 is a plan view illustrating first lines located in the intermediate area MA of the display panel 10 according to an embodiment. The following will be described on the assumption that the first lines include data lines according to an embodiment.

Referring to FIG. 8, the first area RA1 and the second area RA2 may be spaced apart from each other by a predetermined interval. For example, the first area RA1 and the second area RA2 may be spaced apart from each other in the x-direction. First lines (or vertical lines) extending in a direction (e.g., the y-direction) intersecting the x-direction may be located in the intermediate area MA surrounding the first area RA1 and the second area RA2. In FIG. 8, in an embodiment, some data lines DLa, DLb, and DLc from among data lines DLa, DLb, DLc, DLd, and DLe pass through the intermediate area MA as the first lines.

For convenience of explanation, from among the data lines DLa, DLb, and DLc passing through the intermediate area MA, the data lines DLa passing between the first and second areas RA1 and RA2 are referred to as a first group. From among the data lines DLa, DLb, and DLc passing through the intermediate area MA, the data lines DLb disposed on one side, for example, a left side, of the data lines DLa of the first group in FIG. 8 are referred to as a second group, and the data lines DLc disposed on the other side, for example, a right side, of the data lines DLa of the first group are referred to as a third group. A portion of the intermediate area MA where the data lines DLa of the first group are disposed is referred to as a first sub-intermediate area SMA1, a portion of the intermediate area MA where the data lines DLb of the second group are disposed is referred to as a second sub-intermediate area SMA2, and a portion of the intermediate area MA where the data lines DLc of the third group are disposed is referred to as a third sub-intermediate area SMA3. The first through third sub-intermediate areas SMA1, SMA2, and SMA3 may be arranged along the x-direction. The first sub-intermediate area SMA1 may be an area between a first point VCP1 and a second point VCP2, the second sub-intermediate area SMA2 may be an area between the first point VCP1 and a left end of the intermediate area MA, and the third sub-intermediate area SMA3 may be an area between the second point VCP2 and a right end of the intermediate area MA.

The data lines DLa, DLb, and DLc of the first through third groups may substantially extend in the y-direction to apply signals to pixels disposed upper or lower portions of the intermediate area MA in a plan view, and may bypass around the first area RA1 and the second area RA2 along an edge of the first area RA1 and the second area RA2 in the intermediate area MA. A pitch (or an interval) Δd between adjacent (neighboring) data lines in the intermediate area MA from among the data lines DLa, DLb, and DLc of the first through third groups may be less than a pitch (or an interval) Δp between neighboring data lines in the display area DA. For example, the pitch (or the interval) Δd between neighboring data lines located between the first and second areas RA1 and RA2 may be less than the pitch (or the interval) Δp between neighboring data lines located in the display area DA.

Referring to the vicinity of the first area RA1, some data lines of the data lines DLa of the first group may bypass around an edge of one side of the first area RA1 (e.g., a right side of the first area RA1 of FIG. 8) and the data lines DLb of the second group may bypass along an edge of another side of the first area RA1 (e.g., a left side of the first area RA1 of FIG. 8). The data lines of the data lines DLa of the first group and the data lines DLb of the second group may bypass around the first area RA1 by extending in opposite directions to each other with respect to the first point VCP1. The first point VCP1 may be located on a first vertical virtual line VCL1 that passes through a first center C1 of the first area RA1 and extends in the y-direction.

Data lines bypassing the first area RA1, for example, the some data lines of the data lines DLb of the second group and the data lines DLa of the first group, may be symmetric about the first vertical virtual line VCL1.

Referring to the vicinity of the second area RA2, some data lines of the data lines DLa of the first group may bypass around an edge of one side of the second area RA2 (e.g., a left side of the second area RA2 of FIG. 8), and the data lines DLc of the third group may bypass around an edge of another side of the second area RA2 (e.g., a right side of the second area RA2 of FIG. 8). The some data lines of the data lines DLa of the first group and the data lines DLc of the third group may bypass around the second area RA2 by extending in opposite directions to each other with respect to the second point VCP2. The second point VCP2 is not located on a second vertical virtual line VCL2 that passes through a second center C2 of the second area RA2 and extends in the y-direction. The second point VCP2 may be offset in the x-direction from the second vertical virtual line VCL2 toward a right edge of the second area RA2. For example, as shown in FIG. 8, the second point VCP2 may be spaced apart from the second vertical virtual line VCL2 in the x-direction and may be located away from the first area RA1. For example, the second point VCP2 of FIG. 8 may be located at a right side of the second vertical virtual line VCL2.

Data lines bypassing the second area RA2, for example, the data lines of the data lines DLc of the third group and the some data lines DLa of the first group, may be asymmetric about the second vertical virtual line VCL2.

Since the second point VCP2 is offset in the x-direction from the second vertical virtual line VCL2, a relatively large number of data lines from among the data lines bypassing the second area RA2 may be located in the first sub-intermediate area SMA1. The number of the data lines DLa of the first group located in the first sub-intermediate area SMA1 may be greater than half a sum of the numbers of the data lines DLa, DLb, and DLc passing through the intermediate area MA. For example, the number of the data lines DLa of the first group located in the first sub-intermediate area SMA1 may be greater than a sum of the numbers of the data lines DLb and DLc of the second and third groups located in the second and third sub-intermediate areas SMRA2 and SMRA3.

Since a relatively large number of data lines from among data lines passing through the intermediate area MA are located in the first sub-intermediate area SMA1, second and third widths W2 and W3 of the second and third sub-intermediate areas SMRA2 and SMRA3 may be reduced. Each of the second and third widths W2 and W3 of the second and third sub-intermediate areas SMA2 and SMA3 may be less than a first width W1 of the first sub-intermediate area SMA1. A sum of the second width W2 of the second sub-intermediate area SMA2 and the third width W3 of the third sub-intermediate area SMA3 may be less than the first width W1 of the first sub-intermediate area SMA1 (W2+W3<W1). The first width W1 may be a shortest width between the first area RA1 and the second area RA2. The second width W2 may be a shortest width between an end (boundary) of the intermediate area MA and the first area RA1, and the third width W3 may be a shortest width between an end (boundary) of the intermediate area MA and the second area RA2. In an embodiment, the second and third widths W2 and W3 may be measured on an extended line connecting the first center C1 to the second center C2. In an embodiment, the boundary of the intermediate area MA may be defined as a closed loop-shaped area formed by pixels of the display area DA disposed closest to the intermediate area MA are arranged to surround the intermediate area MA.

Figure 9A:
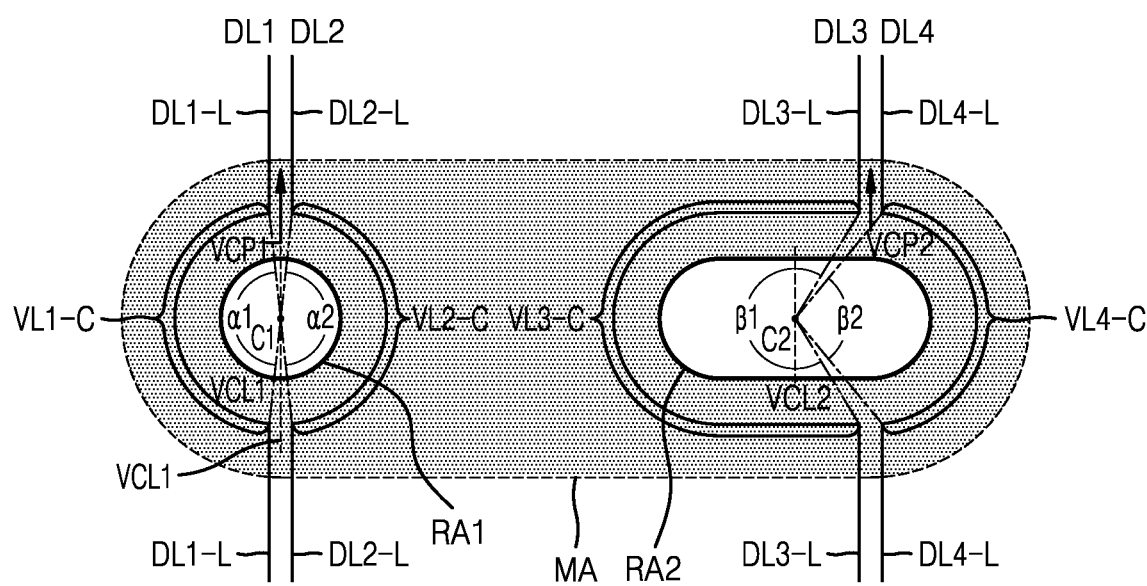
FIG. 9A is a plan view illustrating the first lines of FIG. 8.
Figure 9A:
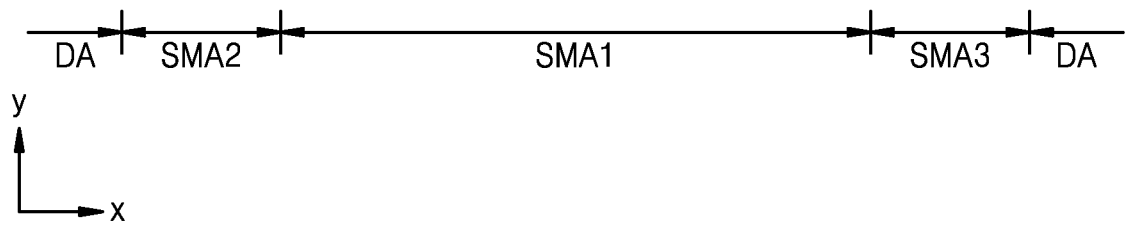
Figure 9B:
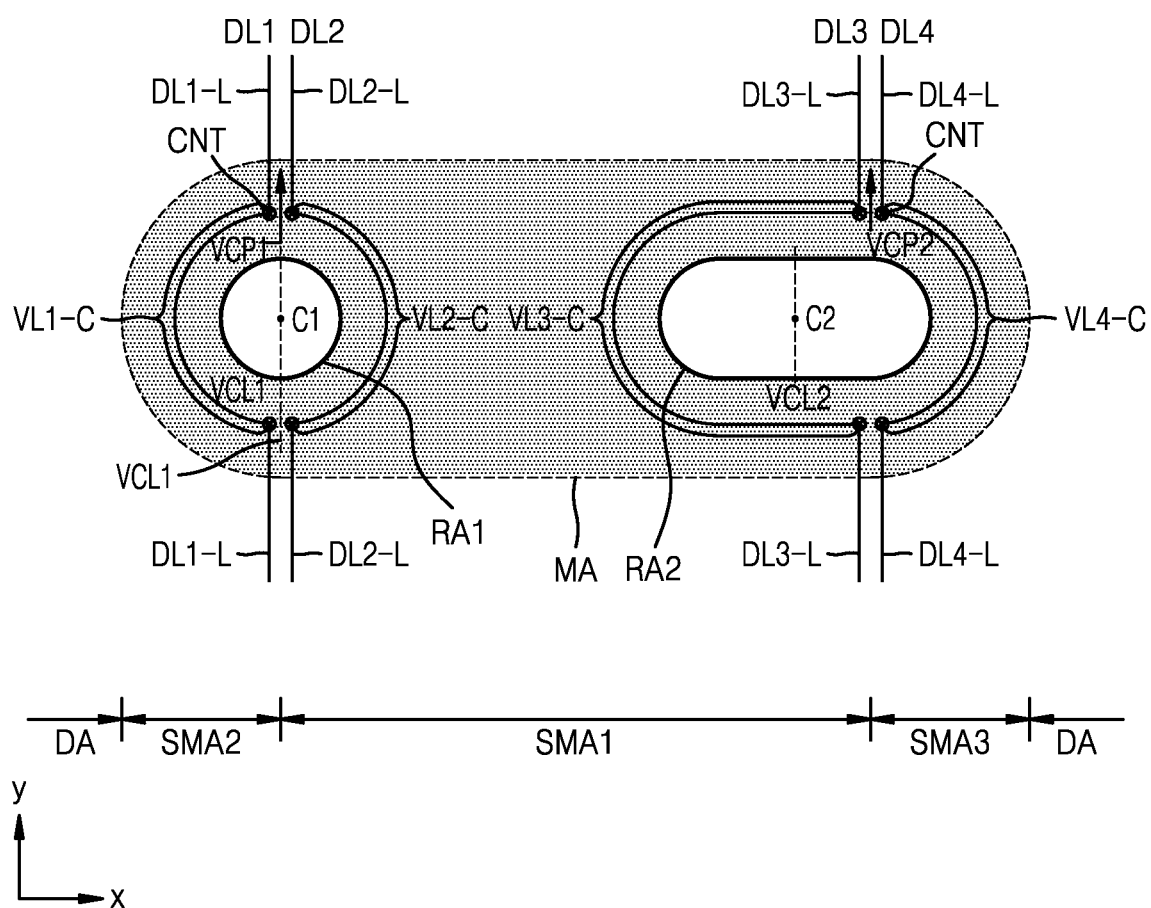
FIG. 9B is a plan view illustrating a modification of FIG. 9A.

FIG. 9A is a plan view illustrating the first lines of FIG. 8. FIG. 9B is a modification of FIG. 9A. In FIGS. 9A and 9B, the first lines include data lines according to an embodiment.

A first data line DL1 of FIGS. 9A and 9B is one of the data lines DLb of the second group of FIG. 8, and a second data line DL2 is one bypassing the first area RA1 from among the data lines DLa of the first group of FIG. 8. A third data line DL3 of FIGS. 9A and 9B is one bypassing the second area RA2 from among the data lines DLa of the first group of FIG. 8, and a fourth data line DL4 is one of the data lines DLc of the third group of FIG. 8.

Referring to FIG. 9A, the first data line DL1 and the second data line DL2 are located adjacent to each other with the first vertical virtual line VCL1 interposed therebetween. The first point VCP1 may be located between the neighboring first and second data lines DL1 and DL2. The first point VCP1 may be located on the first vertical virtual line VCL1. The first data line DL1 extends to bypass around a left edge of the first area RA1, and the second data line DL2 extends to bypass around a right edge of the first area RA1. A central angle α1 of a bypassing portion DL1-C of the first data line DL1 may be the same as a central angle α2 of a bypassing portion DL2-C of the second data line DL2.

The third data line DL3 and the fourth data line DL4 may be located adjacent to each other, and the second point VCP2 may be located between the neighboring third and fourth data lines DL3 and DL4. The second point VCP2 may be offset in the x-direction by a predetermined interval (a distance) from the second vertical virtual line VCL2. The third data line DL3 extends to bypass around a left edge of the second area RA2, and the fourth data line DL4 extends to bypass around a right edge of the second area RA2. A central angle β1 of a bypassing portion DL3-C of the third data line DL3 may be different from a central angle β2 of a bypassing portion DL4-C of the fourth data line DL4. For example, the central angle β1 of a bypassing portion DL3-C of the third data line DL3 may be greater than the central angle β2 of a bypassing portion DL4-C of the fourth data line DL4.

The central angles α1, α2, β1, and β2 may be included angles of arcs of the bypassing portions DL1-C, DL2-C, DL3-C, and DL4-C.

Although the bypassing portions DL1-C, DL2-C, DL3-C, and DL4-C of the first through fourth data lines DL1, DL2, DL3, and DL4 are illustrated as a curved lines in FIG. 9A, the present disclosure is not limited thereto. In another embodiment, the bypassing portions DL1-C, DL2-C, DL3-C, and DL4-C may have step-wise shaped line having zigzag configuration Referring to FIG. 9A, the bypassing portions DL1-C, DL2-C, DL3-C, and DL4-C of the first through fourth data lines DL1, DL2, DL3, and DL4 may be integrally formed with linear portions DL1-L, DL2-L, DL3-L, and DL4-L. In another embodiment, the bypassing portions DL1-C, DL2-C, DL3-C, and DL4-C of one or more data lines from among the first through fourth data lines DL1, DL2, DL3, and DL4 may be disposed on layers different from layers on which the linear portions DL1-L, DL2-L, DL3-L, and DL4-L are disposed, and may respectively connected to the linear portions DL1-L, DL2-L, DL3-L, and DL4-L through contact holes. In this regard, in FIG. 9B, the bypassing portions DL1-C, DL2-C, DL3-C, and DL4-C of the first through fourth data lines DL1, DL2, DL3, and DL4 are connected to the linear portions DL1-L, DL2-L, DL3-L, and DL4-L through contact holes CNT.

Figure 10A:
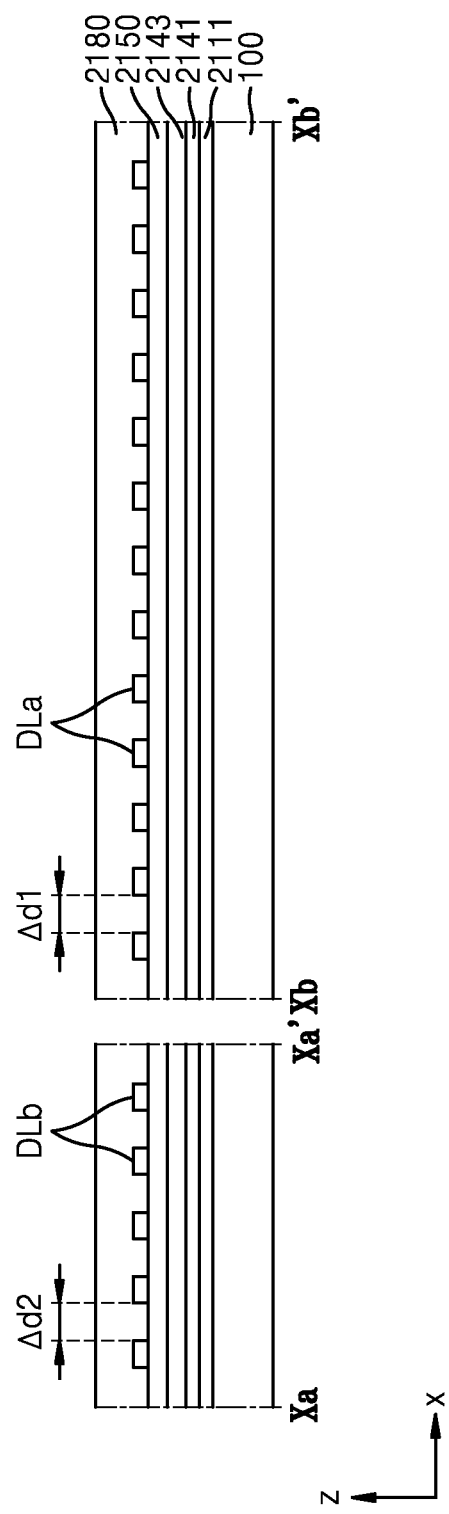
FIGS. 10A and 10B are cross-sectional views illustrating first lines located in the intermediate area of the display panel according to an embodiment.
Figure 10B:
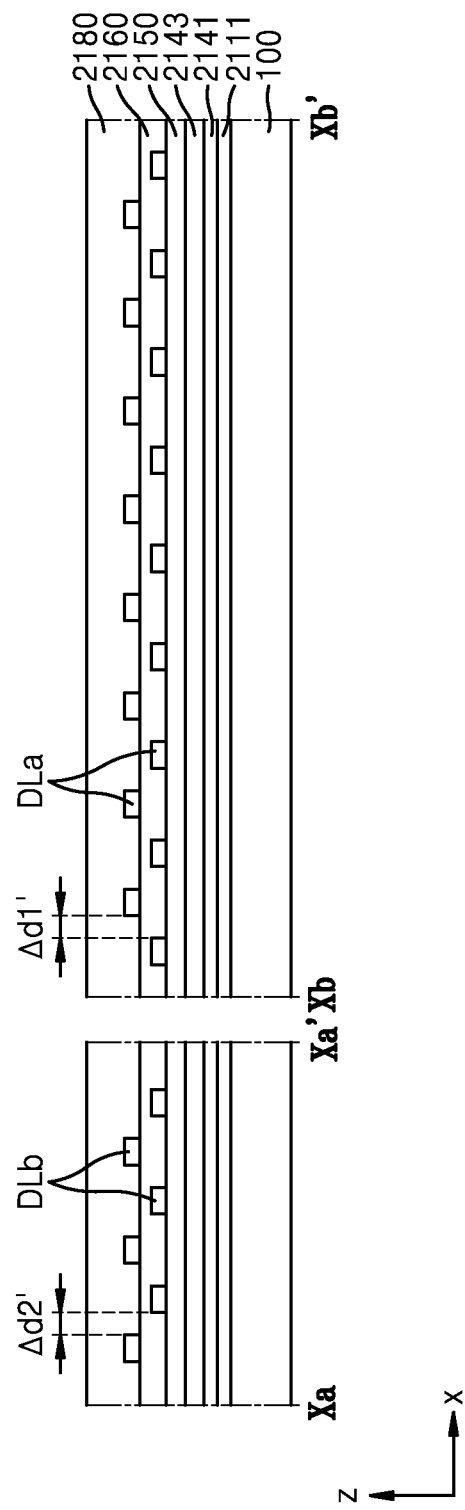

FIG. 10A is a cross-sectional view taken along lines Xa-Xa' and Xb-Xb' of FIG. 8, illustrating first lines located in the intermediate area MA of the display panel 10 according to an embodiment. FIG. 10B is a cross-sectional view taken along lines Xa-Xa' and Xb-Xb' of FIG. 8, illustrating first lines located in the intermediate area MA of the display panel 10 according to another embodiment. In FIGS. 10A and 10B, the first lines include data lines.

Referring to FIG. 10A, the data lines DLa of the first group and the data lines DLb of the second group are located on the same layer. The data lines DLa of the first group and the data lines DLb of the second group may be located on the second interlayer insulating layer 2150.

The data lines DLa of the first group may be arranged to have a first pitch Δd1, and the data lines DLb of the second group may be arranged to have a second pitch Δd2. The first pitch Δd1 and the second pitch Δd2 may correspond to the pitch Δd of FIG. 8. The first pitch M1 and the second pitch Δd2 may be the same or different from each other.

Referring to FIG. 10B, neighboring data lines of the data lines DLa and DLb of the first group and the second group may be located on different layers. For example, one of neighboring data lines DLa of the first group may be located on the second interlayer insulating layer 2150, and the remaining one of the neighboring data lines DLa of the first group may be located on a third interlayer insulating layer 2160. Likewise, one of neighboring data lines DLb of the second group may be located on the second interlayer insulating layer 2150, and the remaining one may be located on the third interlayer insulating layer 2160. Alternatively, one of neighboring data lines DLb of the second group may be located on the first interlayer insulating layer 2143, and the remaining one may be located on the second interlayer insulating layer 2150. Likewise, neighboring data lines DLc of the third group may be located on different layers with an insulating layer therebetween.

Although the third interlayer insulating layer 2160 is further provided in FIG. 10B when compared to FIG. 10A, in another embodiment, one of neighboring data lines DLa of the first group may be located on the first interlayer insulating layer 2143, and the remaining one may be located on the second interlayer insulating layer 2150.

When neighboring data lines are located on different layers, a first pitch (or a first interval) Δd1' between the data lines DLa of the first group may be less than the first pitch (or a first interval) Δd1 of FIG. 10A. Likewise, a second pitch (or a second interval) Δd2' between the data lines DLb of the second group may be less than the second pitch (or a second interval) Δd2 of FIG. 10A. In FIG. 10B, the first pitch Δd1' and the second pitch Δd2' may be the same or different from each other.

Figure 11:
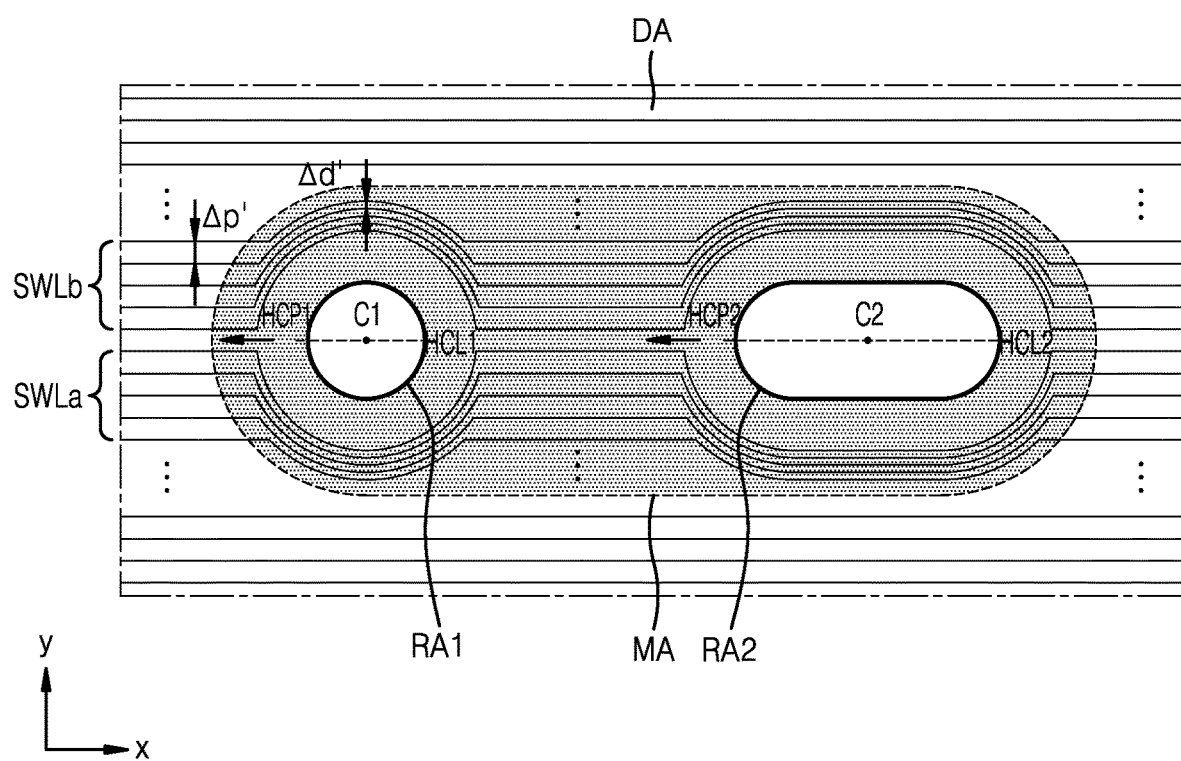
FIG. 11 is a plan view illustrating second lines located in the intermediate area of the display panel according to an embodiment.

FIG. 11 is a plan view illustrating second lines located in the intermediate area MA of the display panel 10 according to an embodiment. In FIG. 11, the second lines include scan lines according to an embodiment.

Referring to FIG. 11, second lines (or horizontal lines) extending in the x-direction may be located in the intermediate area MA around the first area RA1 and the second area RA2 that are spaced apart from each other in the x-direction. In FIG. 11 the second lines include scan lines SWLa of a first group and scan lines SWLb of a second group passing through the intermediate area MA according to an embodiment.

The scan lines SWLa and SWLb of the first group and the second group may extend in the x-direction to apply signals to pixels located at left and right sides of the intermediate area MA in a plan view, and may bypass around edges of the first and second areas RA1 and RA2 in the intermediate area MA. From among the scan lines SWLa and SWLb of the first and second groups, a pitch (or an interval) Δd between neighboring scan lines in the intermediate area MA may be less than a pitch (or an interval) Δp' between neighboring scan lines in the display area DA.

The scan lines SWLa of the first group and the scan lines SWLb of the second group may be symmetric about first and second horizontal virtual lines HCL1 and HCL2 passing through the first and second centers C1 and C2. For example, the scan lines SWLa of the first group disposed on an upper portion of a line connecting the first and second centers C1 and C2 may extend to bypass around lower edges of the first and second areas RA1 and RA2, and the scan lines SWLb of the second group disposed on a lower portion of the line connecting the first and second centers C1 and C2 may extend to bypass around upper edges of the first and second areas RA1 and RA2. The number of the scan lines SWLa of the first group and the number of and the scan lines SWLb of the second group may be the same.

Although bypassing portions of the scan lines SWLa of the first group and the scan lines SWLb of the second group are illustrated as curved lines in FIG. 11, the present disclosure is not limited thereto. In another embodiment, the bypassing portions may have step-wise shaped line having a zigzag configuration.

Referring to FIGS. 8 and 11, first lines, for example, data lines, passing through the vicinity of the second area RA2 may be asymmetric about the second vertical virtual line VCL2 that passes through the second center C2 in the second area RA2, and second lines, for example, scan lines, passing through the vicinities of the first and second areas RA1 and RA2 may be symmetric about first and second horizontal virtual lines HCL1 and HCL2 passing through the first and second centers C1 and C2 of the first and second areas RA1 and RA2.

Figure 12:
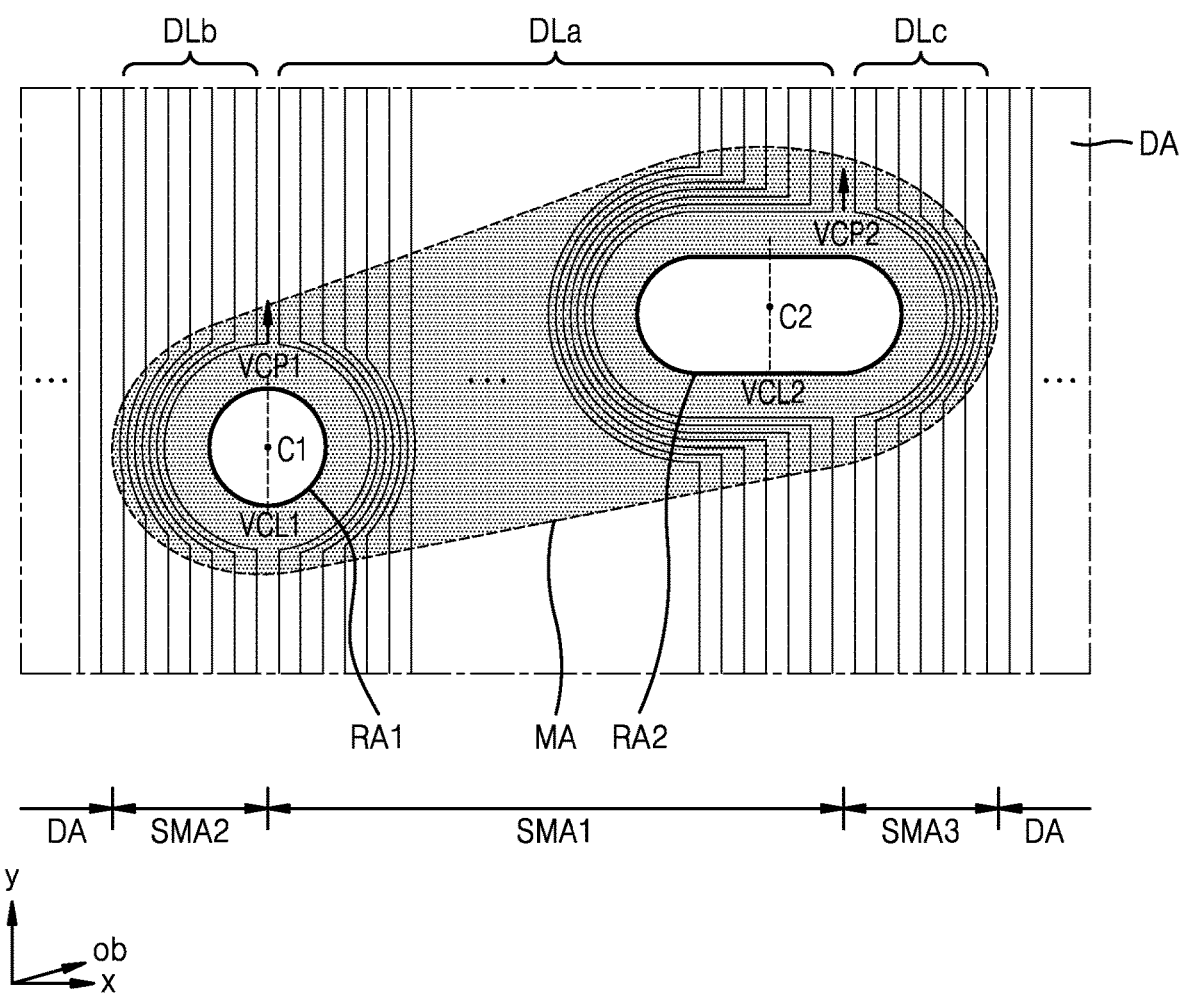
FIG. 12 is a plan view illustrating first lines located in the intermediate area of the display panel according to another embodiment.
Figure 13:
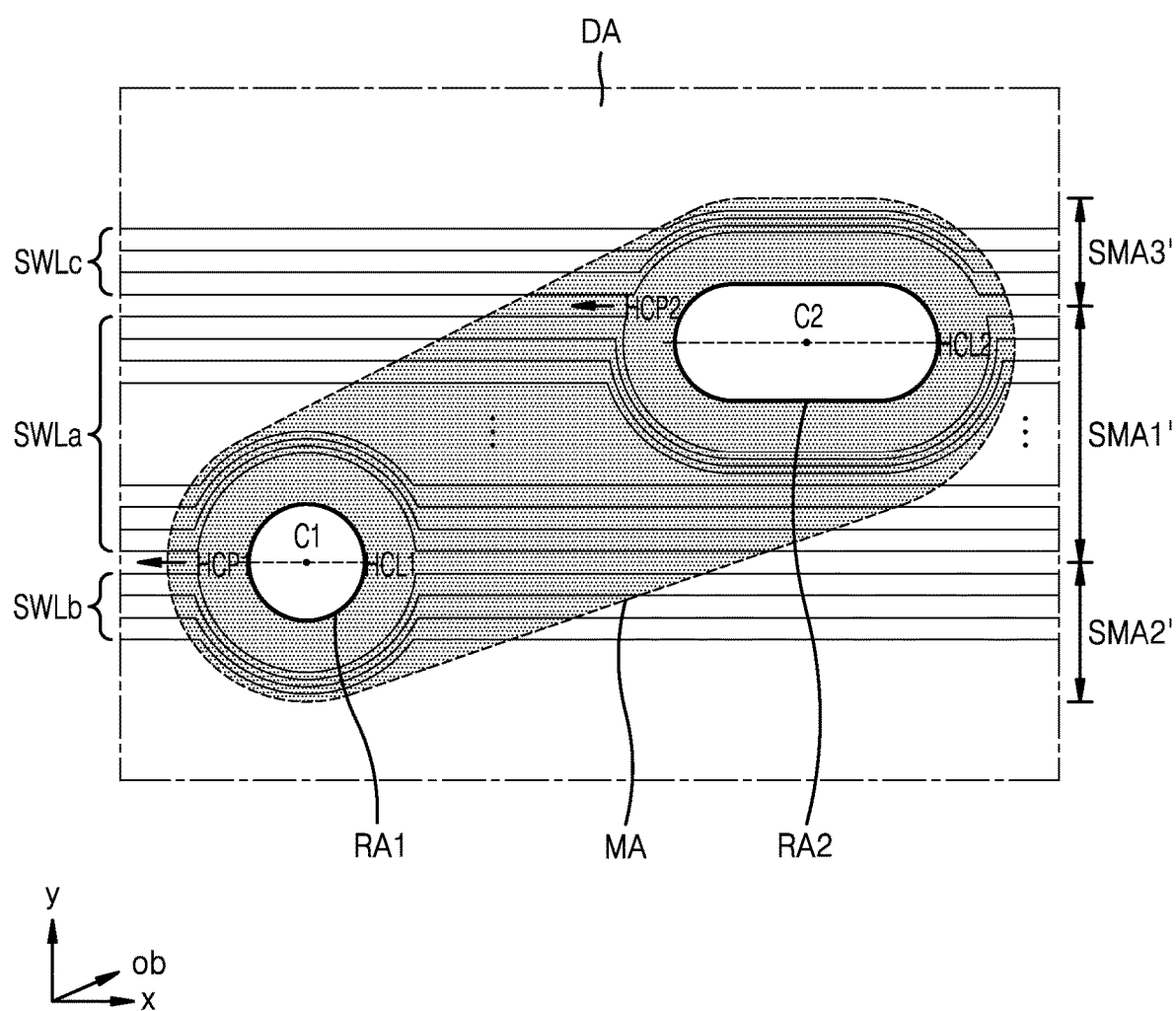
FIG. 13 is a plan view illustrating second lines located in the intermediate area of the display panel according to another embodiment.

FIG. 12 is a plan view illustrating first lines located in the intermediate area MA of the display panel 10 according to another embodiment. FIG. 13 is a plan view illustrating second lines located in the intermediate area MA of the display panel 10 according to another embodiment.

While the first and second areas RA1 and RA2 are spaced apart from each other in the x-direction in FIG. 8, the first and second areas RA1 and RA2 may be spaced apart from each other in an oblique (ob)-direction that is inclined with respect to the x-direction and the y-direction in FIGS. 12 and 13. First lines are data lines in FIG. 12, and second lines are scan lines in FIG. 13.

Referring to FIG. 12, the data lines DLa, DLb, and DLc of the first through third groups are located around the first and second areas RA1 and RA2 arranged in the ob-direction. The data lines DLa, DLb, and DLc of the first through third groups may extend in the y-direction intersecting the ob-direction, and may bypass around an edge of the first or second area RA1 or RA2. Structures of the data lines DLa, DLb, and DLc of the first through third groups are the same as those described with reference to FIGS. 8 through 10B. For example, some data lines of the data lines DLa of the first group and the data lines DLb of the second group may bypass around the first area RA1 by extending in opposite directions from the first point VCP1. Some data lines of the data lines DLa of the first group and the data lines DLc of the third group may bypass around the second area RA2 by extending in opposite directions from the second point VCP2. The first point VCP1 may be located on the first vertical virtual line VCL1 that passes through the first center C1 and extends in the y-direction, and the second point VCP2 may not be located on the second vertical virtual line VCL2 that passes through the second center C2 of the second area RA2 and extends in the y-direction. Data lines bypassing the second area RA2 from among the first and second areas RA1 and RA2 may be asymmetric as described above with reference to FIG. 8. The number of the data lines DLa of the first group located in the first sub-intermediate area SMA1 may be greater than a sum of the numbers of the data lines DLb and DLc of the second and third groups located in the second and third sub-intermediate areas SMA2 and SMA3.

Referring to FIG. 13, scan lines SWLa, SWLb, and SWLc of first through third groups are located around the first and second areas RA1 and RA2 arranged in the ob-direction. The scan lines SWLa, SWLb, and SWLc of the first through third groups may be respectively located in first through third sub-intermediate areas SMA1', SMA2', and SMA3'. The first through third sub-intermediate areas SMA1', SMA2', and SMA3' may be arranged in the y-direction in FIG. 13. The first sub-intermediate area SMA1' may be an area between the third point HCP1 and the fourth point HCP2, the second sub-intermediate area SMA2' may be an area between the third point HCP1 and a lower end of the intermediate area MA, and the third sub-intermediate area SMA3' may be an area between the fourth point HCP2 and an upper end of the intermediate area MA.

The scan lines SWLa, SWLb, and SWLc of the first through third groups may extend in the x-direction intersecting the ob-direction, and may bypass around an edge of the first or second area RA1 or RA2.

Referring to the vicinity of the first area RA1, some scan lines of the scan lines SWLa of the first group may bypass around an edge of one side of the first area RA1 (e.g., an upper side of the first area RA1 in FIG. 13), and the scan lines SWLb of the second group may bypass around an edge of another side of the first area RA1 (e.g., a lower side of the first area RA1 in FIG. 13). The some scan lines of the scan lines SWLa of the first group and the scan lines SWLb of the second group may bypass around the first area RA1 by extending in opposite directions from the third point HCP1. The third point HCP1 may be located on the first horizontal virtual line HCL1 that passes through the first center C1 and extends in the x-direction.

Scan lines bypassing the first area RA1, for example, the some scan lines of the scan lines SWLa of the first group and the scan lines SWLb of the second group may be symmetric about the first horizontal virtual line HCL1.

Referring to the vicinity of the second area RA2, some scan lines of the scan lines SWLa of the first group may bypass around an edge of one side of the second area RA2 (e.g., a lower side of the second area RA2 in FIG. 13), and may bypass around an edge of another side of the second area RA2 (e.g., an upper side of the second area RA2 in FIG. 13). The some scan lines of the scan lines SWLa of the first group and the scan lines SWLc of the third group may bypass around the second area RA2 by extending in opposite directions from the fourth point HCP2. The fourth point HCP2 is not located on the second horizontal virtual line HCL2 that passes through the second center C2 of the second area RA2 and extends in the x-direction. The fourth point HCP2 may be offset in the y-direction from the second horizontal virtual line HCL2 toward an upper edge of the second area RA2. For example, as shown in FIG. 13, the fourth point HCP2 may be spaced apart from the second horizontal virtual line HCL2 in the y-direction and may be located away from the first area RA1. For example, the fourth point HCP2 may be located over the second horizontal virtual line HCL2 in FIG. 13.

Scan lines bypassing the second area RA2, for example, the some scan lines of the scan lines SWLa of the first group and the scan lines SWLc of the third group may be asymmetric about the second horizontal virtual line HCL2.

Since the fourth point HCP2 is offset in the y-direction from the second horizontal virtual line HCL2, a relatively large number of scan lines from among the scan lines bypassing the second area RA2 may be located in the first sub-intermediate area SMA1'.

The number of the scan lines SWLa of the first group located in the first sub-intermediate area SMA1' may be greater than half a sum of the numbers of the scan lines SWLa, SWLb, and SWLc passing through the intermediate area MA. For example, the number of the scan lines SWLa of the first group located in the first sub-intermediate area SMA1' may be greater than a sum of the numbers of the scan lines SWLb and SWLc of the second and third groups located in the second and third sub-intermediate areas SMRA2' and SMRA3'.

Figure 14:
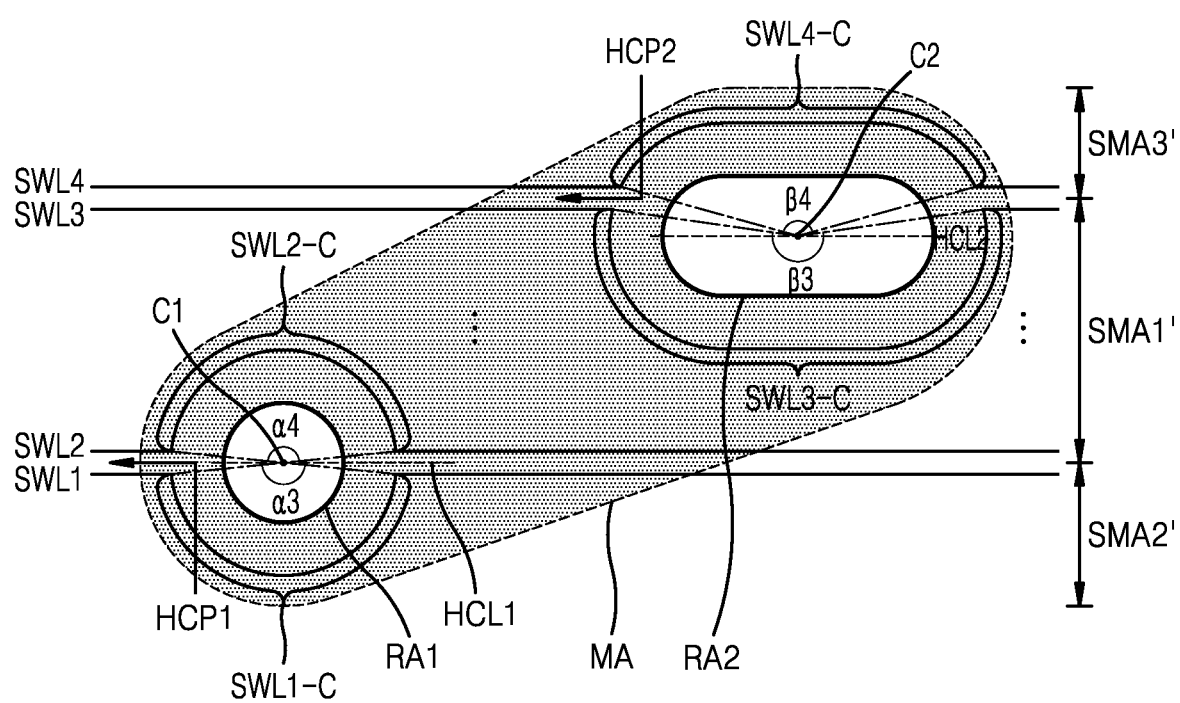
FIG. 14 is a plan view illustrating the second lines of FIG. 13.
Figure 14:
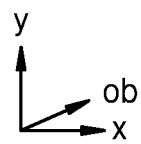

FIG. 14 is a plan view illustrating the second lines of FIG. 13. The second lines of FIG. 14 may include scan lines described with reference to FIG. 13.

A first scan line SWL1 of FIG. 14 may be one of the scan lines SWLb of the second group of FIG. 13, and a second scan line SWL2 is one bypassing the first area RA1 from among the scan lines SWLa of the first group of FIG. 13. A third scan line SWL3 may be one bypassing the second area RA2 from among the scan lines SWLa of the first group of FIG. 13, and a fourth scan line SWL4 is one of the scan lines SWLc of the third group of FIG. 13.

Referring to FIG. 14, the first scan line SWL1 and the second scan line SWL2 are located adjacent to each other with the first horizontal virtual line HCL1 disposed therebetween. The third point HCP1 may be located between the neighboring first and second scan lines SWL1 and SWL2. The third point HCP1 may be located on the first horizontal virtual line HCL1. The first scan line SWL1 bypasses around a lower edge of the first area RA1 from the third point HCP1, and the second line SWL2 bypasses around an upper edge of the first area RA1 from the third point HCP1. A central angle α3 of a bypassing portion SWL1-C of the first scan line SWL1 may be the same as a central angle α4 of a bypassing portion SWL2-C of the second scan line SWL2.

The third scan line SWL3 and the fourth scan line SWL4 may be located adjacent to each other with the second horizontal virtual line HCL2 disposed therebetween, and the fourth point HCP2 may be located between the neighboring third and fourth scan lines SWL3 and SWL4. The fourth point HCP2 may be offset by a predetermined distance from the second horizontal virtual line HCL2. The third scan line SWL3 bypasses around a lower edge of the second area RA2 from the fourth point HCP2, and the fourth scan line SWL4 bypasses around an upper edge of the second area RA2 from the fourth point HCP2. A central angle β3 of a bypassing portion SWL3-C of the third scan line SWL3 may be different from a central angle β4 of a bypassing portion SWL4-C of the fourth scan line SWL4. For example, the central angle β3 of the bypassing portion SWL3-C of the third scan line SWL3 may be greater than the central angle β4 of the bypassing portion SWL4-C of the fourth scan line SWL4.

The central angles α3, β4, β3, and β4 may be included angles of arcs of the bypassing portions SWL1-C, SWL2-C, SWL3-C, and SWL4-C.

Although the bypassing portions SWL1-C, SWL2-C, SWL3-C, and SWL4-C of the first through fourth scan lines SWL1, SWL2, SWL3, and SWL4 are illustrated as curved lines in FIG. 14, in another embodiment, the bypassing portions SWL1-C, SWL2-C, SWL3-C, and SWL4-C may have a step-wise shape having a zigzag configuration.

The bypassing portions SWL1-C, SWL2-C, SWL3-C, and SWL4-C of the first through fourth scan lines SWL1, SWL2, SWL3, and SWL4 and linear portions may be located on the same layer. Alternatively, like data lines described with reference to FIG. 9B, the bypassing portions SWL1-C, SWL2-C, SWL3-C, and SWL4-C of the first through fourth scan lines SWL1, SWL2, SWL3, and SWL4 may be located on layers different from layers on which the linear portions are located, and may respectively be connected to the linear portions through contact holes.

Figure 15:
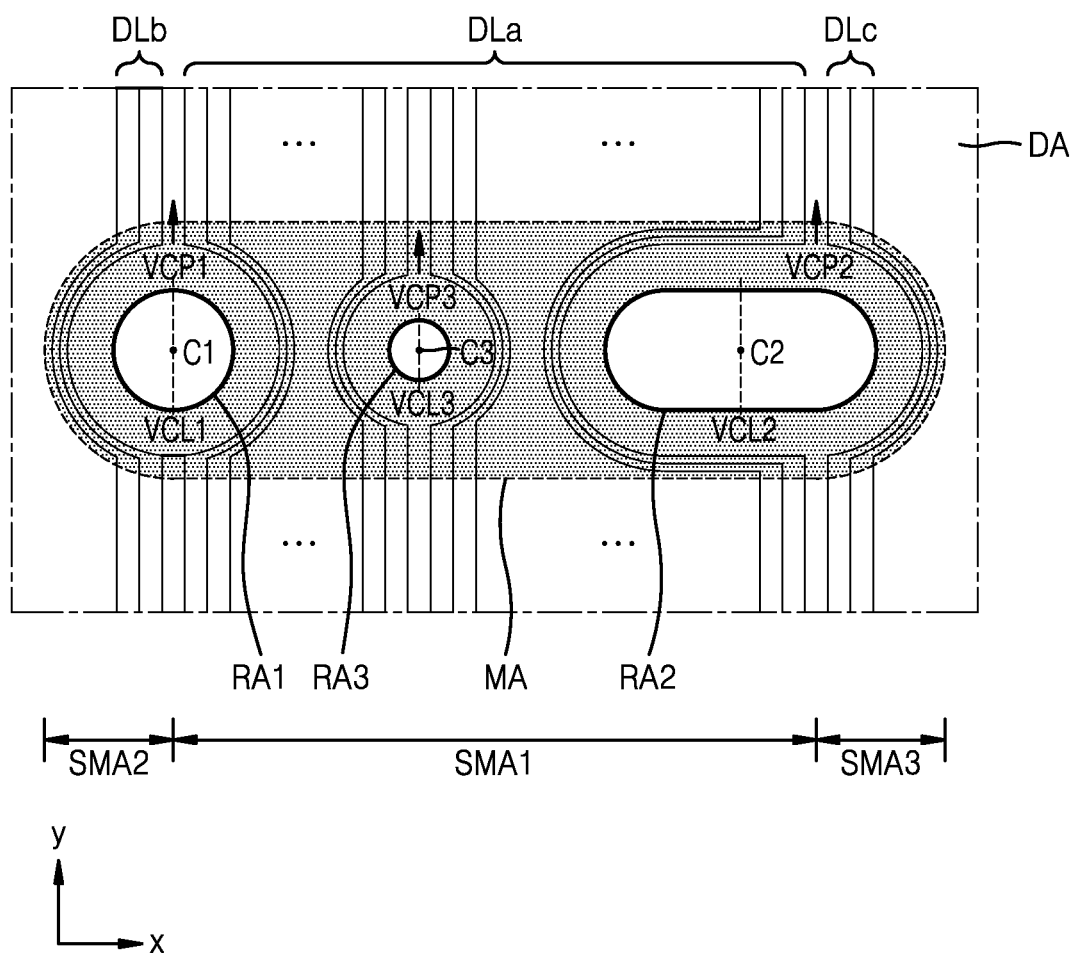
FIG. 15 is a plan view illustrating first lines located in the intermediate area of the display panel according to another embodiment.
Figure 16:
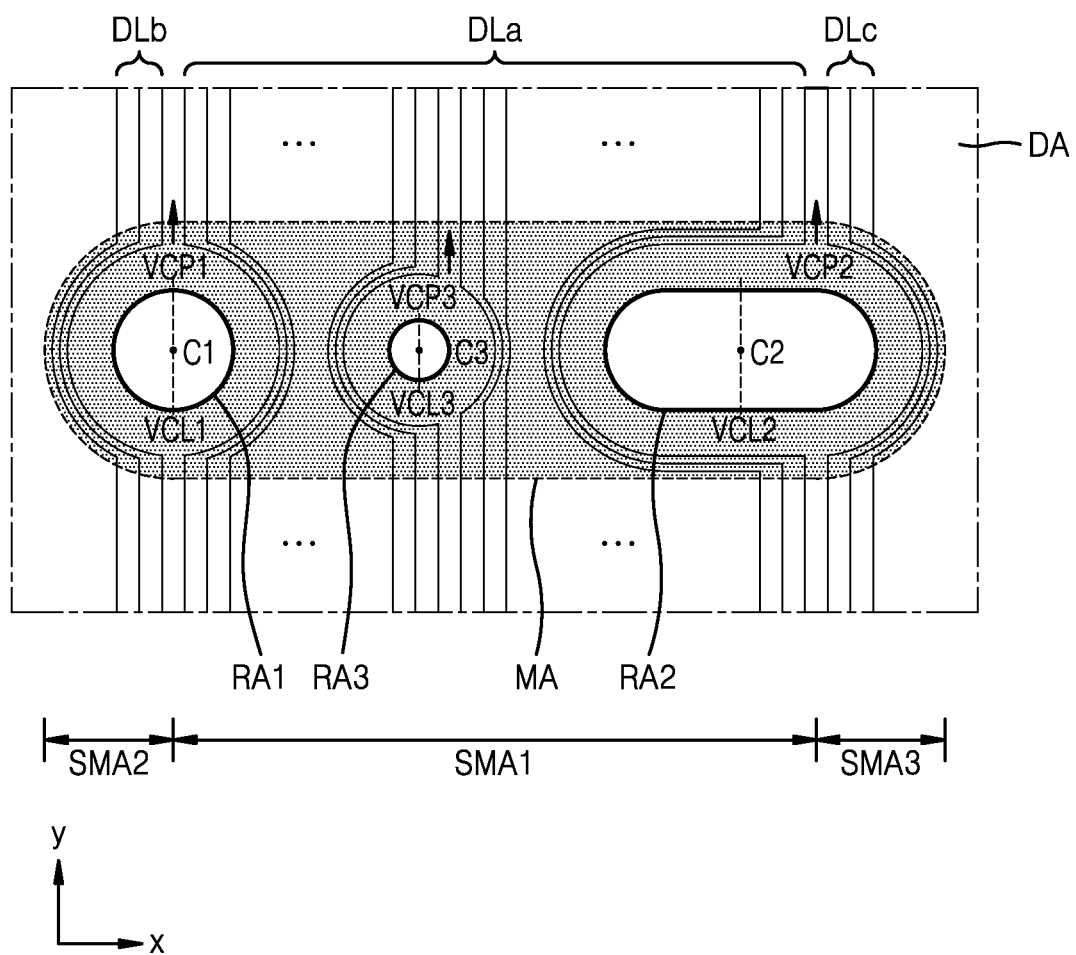
FIG. 16 is a plan view illustrating first lines located in the intermediate area of the display panel according to another embodiment.

FIGS. 15 and 16 are plan views illustrating first lines located in the intermediate area MA of the display panel 10 according to other embodiments. In FIGS. 15 and 16, the first lines include data lines according to an embodiment.

Referring to FIGS. 15 and 16, a third area RA3 may be located between the first area RA1 and the second area RA2. Structures and characteristics of the data lines DLa, DLb, and DLc of the first through third groups about the first and second areas RA1 and RA2 are the same as those described with reference to FIGS. 8 through 10B. The following will focus on data lines about the third area RA3.

Referring to FIG. 15, the data lines DLa of the first group are located around the third area RA3. Some data lines of the data lines DLa of the first group may extend toward a left side of the third area RA3 from a fifth point VCP3 and may bypass around a left edge of the third area RA3, and some data lines of the data lines DLa of the first group may extend toward a right side of the third area RA3 from the fifth point VCP3 and may bypass around a right edge of the third area RA3. The fifth point VCP 3 may be located on a third vertical virtual line VCL3 that passes through a third center C3 of the third area RA3.

Data lines bypassing the third area RA3, for example, the some data lines of the data lines DLa of the first group, may be symmetric about the third vertical virtual line VCL3.

In another embodiment, referring to FIG. 16, data lines bypassing the third area RA3, for example, the some data lines of the data lines DLa of the first group, may be asymmetric about the third vertical virtual line VCL3. In this case, the fifth point VCP3 may be offset from the third vertical virtual line VCL3 that passes through the third center C3 of the third area RA3. In FIG. 16, the fifth point VCP3 is offset from the third vertical virtual line VCL3 to be close to the second area RA2. That is, the fifth point VCP3 may be located at a right side of the third vertical virtual line VCL3. In another embodiment, the fifth point VCP3 may be offset from the third vertical virtual line VCL3 to be close to the first area RA1.

When the third area RA3 is further provided as shown in FIGS. 15 and 16, second lines, for example, scan lines, may be arranged as described with reference to FIG. 11.

Although one third area RA3 is located between the first and second areas RA1 and RA2 in FIGS. 15 and 16, two or more third areas RA3 may be located between the first and second areas RA1 and RA2.

Figure 17:
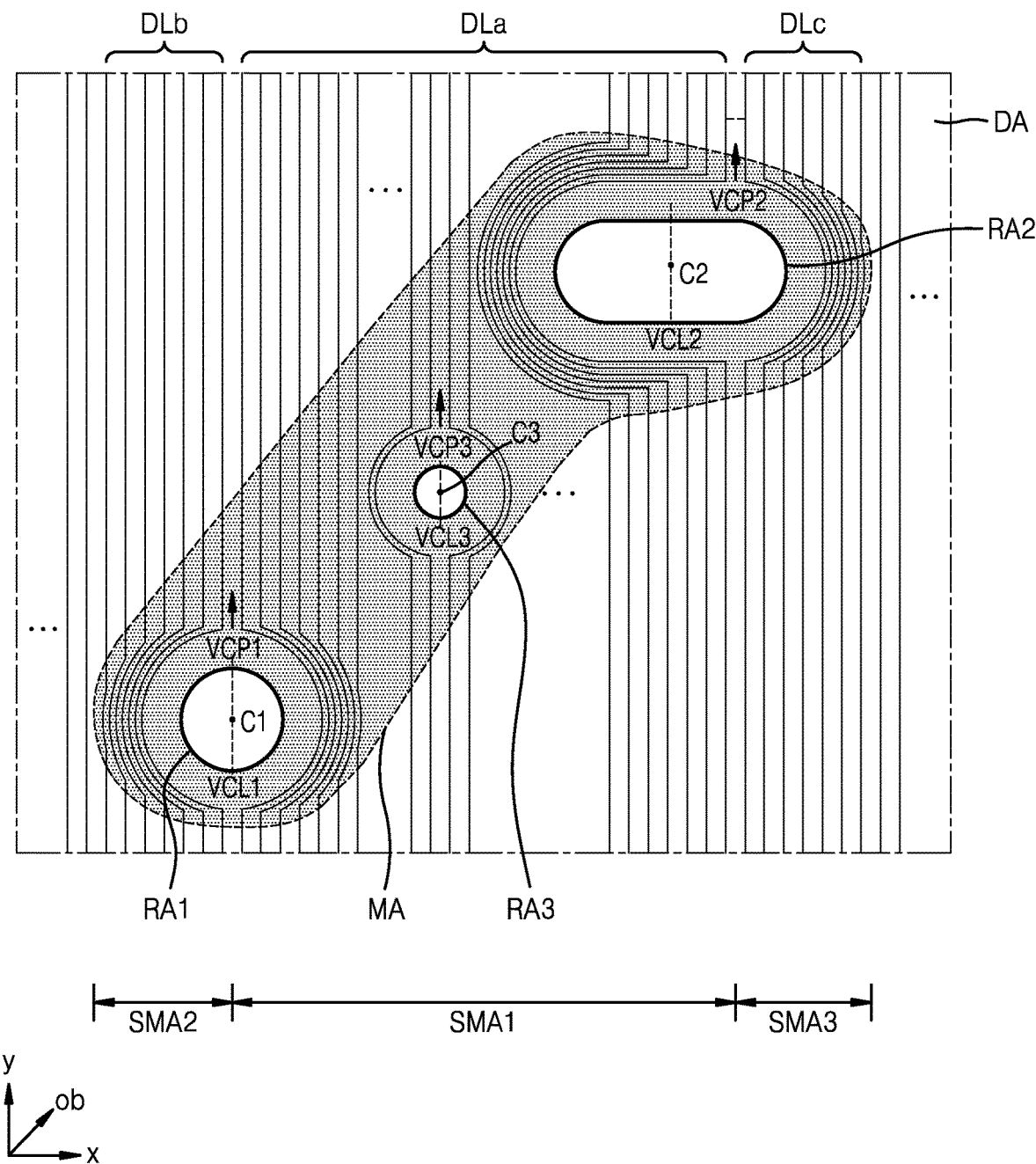
FIG. 17 is a plan view illustrating first lines located in the intermediate area of the display panel according to another embodiment.
Figure 18:
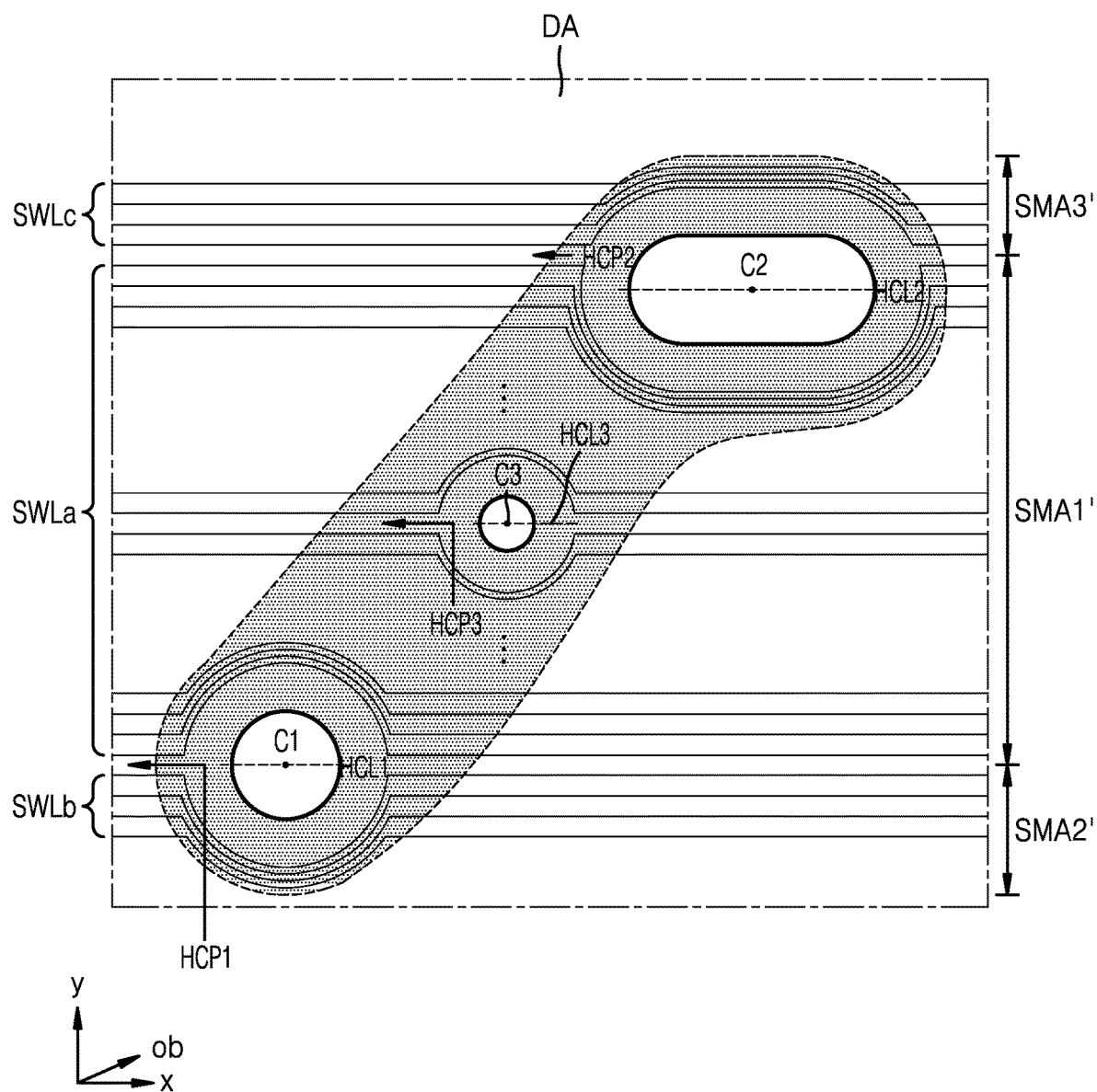
FIG. 18 is a plan view illustrating second lines located in the intermediate area of the display panel according to another embodiment.

FIG. 17 is a plan view illustrating first lines located in the intermediate area MA of the display panel 10 according to another embodiment. FIG. 18 is a plan view illustrating second lines located in the intermediate area MA of the display panel according to another embodiment.

Referring to FIGS. 17 and 18, the first and second areas RA1 and RA2 are arranged in the ob-direction that is inclined with respect to the x-direction and the y-direction. The ob-direction may intersect with the x-direction and/or the y-direction. The third area RA3 may be located between the first and second areas RA1 and RA2 in the ob-direction. For example, the third area RA3 may be located between the first and second areas RA1 and RA2 in the x-direction and the y-direction.

Data lines around the first and second areas RA1 and RA2 arranged in the ob-direction are the same as those described with reference to FIG. 12, and thus the following will focus on data lines around the third area RA3.

Referring to FIG. 17, the data lines DLa of the first group are located around the third area RA3. Some data lines of the data lines DLa of the first group may extend from the fifth point VCP3 to bypass around a left edge of the third area RA3, and some data lines of the data lines DLa of the first group may extend from the fifth point VCP3 to bypass around a right edge of the third area RA3. Although the fifth point VCP3 is located on the third vertical virtual line VCL3 that passes through the third center C3 of the third area RA3 in FIG. 17, the present disclosure is not limited thereto. In another embodiment, the fifth point VCP3 may be offset in the x-direction from the third vertical virtual line VCL3, and in this case, data lines around the third area RA3 may be the same as those described with reference to FIG. 16.

Referring to FIG. 18, scan lines around the first and second areas RA1 and RA2 arranged in the ob-direction are the same as those described with reference to FIG. 13, and thus the following will focus on scan lines around the third area RA3.

Upon examining the vicinity of the third area RA3, some scan lines of the scan lines SWLa of the first group may bypass around one side of the third area RA3 (e.g., an upper side of the third area RA3 in FIG. 18), and some scan lines of the scan lines SWLa of the first group may bypass around an edge of another side of the third area RA3 (e.g., a lower side of the third area RA3 in FIG. 18). Scan lines of the scan lines SWLa of the first group may bypass around the third area RA3 by extending in opposite directions from the sixth point HCP3. The sixth point HCP3 may be located on the third horizontal virtual line HCL3 that passes through the third center C3 of the third area RA3 and extends in the x-direction. Alternatively, the sixth point HCP3 may be offset in the y-direction from the third horizontal virtual line HCL3, and in this case, scan lines bypassing the third area RA3 may be asymmetric about the third horizontal virtual line HCL3.

Figure 19:
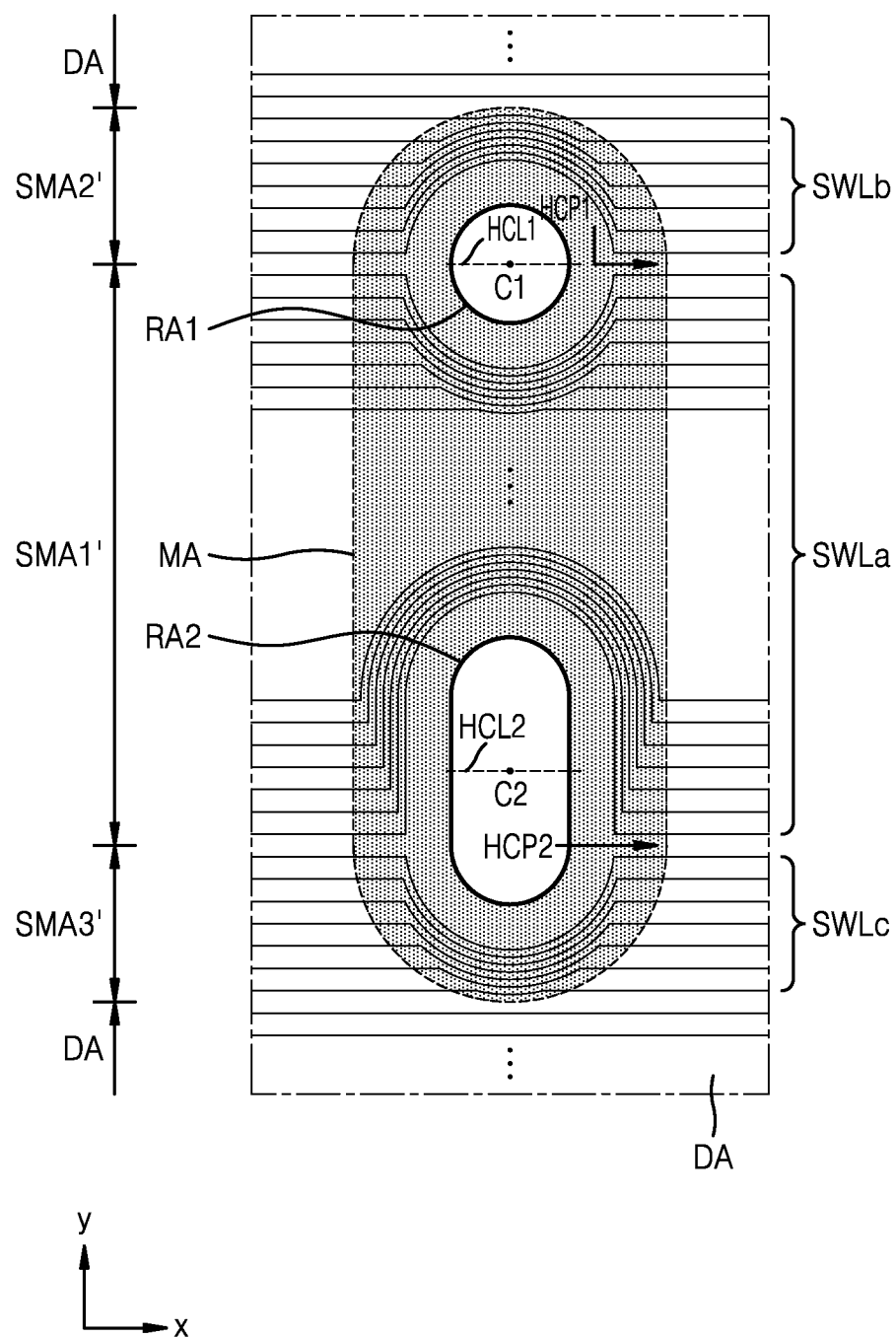
FIG. 19 is a plan view illustrating second lines located in the intermediate area of the display panel according to another embodiment.

FIG. 19 is a plan view illustrating second lines located in the intermediate area MA of the display panel 10 according to another embodiment.

Referring to FIG. 19, the first and second areas RA1 and RA2 may be spaced apart from each other in the y-direction. The scan lines SWLa of the first group are located between the first area RA1 and the second area RA2. The scan lines SWLb of the second group may be located adjacent to the scan lines SWLa of the first group with the first area RA1 disposed therebetween, and the scan lines SWLc of the third group may be located adjacent to the scan lines SWLa of the first group with the second area RA2 disposed therebetween.

Referring to the vicinity of the first area RA1, some scan lines of the scan lines SWLa of the first group and the scan lines SWLb of the second group may bypass around an edge of the first area RA1 by extending in opposite directions from the third point HCP1. The third point HCP1 may be located on the first horizontal virtual line HCL1 that passes through the first center C1 and extends in the x-direction.

Referring to the vicinity of the second area RA2, some scan lines of the scan lines SWLa of the first group and the scan lines SWLc of the third group bypass around the second area RA2 by extending in opposite directions from the fourth point HCP2. The fourth point HCP2 is not located on the second horizontal virtual line HCL2 that passes through the second center C2 of the second area RA2 and extends in the x-direction. The fourth point HCP2 may be offset in the y-direction from the second horizontal virtual line HCL2.

An arrangement of the scan lines SWLa, SWLb, and SWLc of the first through third groups of FIG. 19 may be substantially the same as that described with reference to FIG. 13. When a direction (e.g., the y-direction) in which the first and second areas RA1 and RA2 are arranged is substantially perpendicular to a direction (e.g., the x-direction) in which scan lines extend as shown in FIG. 19, and when a direction (e.g., the ob-direction) in which the first and second areas RA1 and RA2 are arranged intersects a direction (e.g., the x-direction) in which scan lines extend to form an acute angle as shown in FIG. 13, the scan lines in the intermediate area MA may be symmetric about any one of the first and second areas RA1 and RA2 and may be asymmetric about the remaining one of the first and second areas RA12 and RA2.

Although first lines include data lines and second lines include scan lines in the above embodiments, the present disclosure is not limited thereto. In another embodiment, the first lines may include the driving voltage line PL of FIG. 7A and the second lines may include the previous scan line SIL, the emission control line EL, the electrode voltage line HPL, or/and the initialization voltage line VIL of FIG. 7A.

According to the one or more embodiments, since lines around an area corresponding to a component such as a sensor or a camera are asymmetrically arranged, a dead area between a display area and the area may be reduced. However, technical effects of the present disclosure are not limited thereto, and other unmentioned technical effects will be apparent to one of ordinary skill in the art from the following description.

While the present disclosure has been particularly shown and described with reference to embodiments thereof, it will be understood by one of ordinary skill in the art that various changes in form and details may be made therein without departing from the spirit and scope of the present disclosure as defined by the following claims.

What is claimed is:

1. A display panel comprising:
a substrate including a display area, a circular area, and a non-circular area, wherein a plurality of light emitting diodes are arranged in the display area, the circular area and the non-circular area are within the display area apart from each other in a first direction, and the circular area and the non-circular area are surrounded by a non-display area; and
a plurality of lines extending in a second direction crossing the first direction, the plurality of lines being electrically respectively connected to the plurality of light emitting diodes,
wherein the plurality of lines comprises:
a first line and a second line adjacent to each other, the first line bypassing, in the non-display area, along a first side of the circular area and the second line bypassing, in the non-display area, along a second side of the circular area opposite to the first side of the circular area, wherein the first line and the second line are substantially symmetric with respect to a virtual central line passing through a center of the circular area; and
a third line and a fourth line adjacent to each other, the third line bypassing, in the non-display area, along a first side of the non-circular area and the fourth line bypassing, in the non-display area, along a second side of the non-circular area opposite to the first side of the non-circular area, wherein the third line and the fourth line are asymmetric with respect to a virtual central line passing through a center of the non-circular area.

2. The display panel of claim 1, wherein the plurality of lines comprises data lines or scan lines.

3. The display panel of claim 1, wherein the non-circular area has an elliptical shape or a quadrangular shape with rounded corners.

4. The display panel of claim 1, wherein the plurality of lines comprises:
a first group of lines between the circular area and the non-*circulars* area in the non-display area;
a second group of lines between a first edge portion of the non-display area and the circular area; and
a third group of lines between a second edge portion of the non-display area and the non-circular area, and
wherein the number of lines of the first group is greater than a sum of the numbers of lines of the second group and a third group.

5. The display panel of claim 1, wherein:
a first width between the circular area and the non-circular area measured along a virtual straight line coupling the center of the circular area to the center of the non-circular area is greater than a second width between a first edge portion of the non-display area and the circular area measured along the virtual straight line, and
the first width is greater than a third width between a second edge portion of the non-display area and the non-circular area measured along the virtual straight line.

6. The display panel of claim 1, wherein at least one selected from the first to fourth lines comprises:
a first portion and second portion in the display area; and
a curved portion in the non-display area, the curved portion being disposed on a different layer from the first portion and the second portion, wherein the curved portion is electrically connected to the first portion and the second portion via contact holes of an insulation layer that is between the curved portion and the first and second portions.

7. The display panel of claim 1, wherein the substrate comprises at least one opening corresponding to at least one selected from the circular area and the non-circular area.

8. The display panel of claim 1, wherein:
a pitch between two adjacent lines in the display area is greater than that of the two adjacent lines in the non-display area.

9. A display device comprising:
a display panel comprising:
a substrate including a display area, a circular area, and a non-circular area, wherein a plurality of light emitting diodes are arranged in the display area, the circular area and the non-circular area are within the display area apart from each other in a first direction, and the circular area and non-circular area are surrounded by a non-display area;
a plurality of lines extending in a second direction crossing the first direction, the plurality of lines being electrically respectively connected to the plurality of light emitting diodes, and
a first component and a second component located in the circular area and the non-circular area, respectively,
wherein the plurality of lines comprises:
a first line and a second line adjacent to each other, the first line bypassing, in the non-display area, along a first side of the circular area and the second line bypassing, in the non-display area, along a second side of the circular area opposite to the first side of the circular area, wherein the first line and the second line are substantially symmetric with respect to a virtual central line passing through a center of the circular area; and
a third line and a fourth line adjacent to each other, the third line bypassing, in the non-display area, along a first side of the non-circular area and the fourth line bypassing, in the non-display area, along a second side of the non-circular area opposite to the first side of the non-circular area, wherein the third line and the fourth line are asymmetric with respect to a virtual central line passing through a center of the non-circular area.

10. The display device of claim 9, wherein the plurality of lines comprises data lines or scan lines.

11. The display device of claim 9, wherein the non-circular area has an elliptical shape or a quadrangular shape with rounded corners.

12. The display device of claim 9, wherein the plurality of lines comprises:
a first group of lines between the circular area and the non-*circulars* area in the non-display area;
a second group of lines between a first edge portion of the non-display area and the circular area; and
a third group of lines between a second edge portion of the non-display area and the non-circular area, and
wherein the number of lines of the first group is greater than a sum of the numbers of lines of the second group and a third group.

13. The display device of claim 9, wherein the plurality of lines comprises:

a first width between the circular area and the non-circular area measured in a virtual straight line coupling the center of the circular area to the center of the non-circular area is greater than a second width between a first edge portion of the non-display area and the circular area in the virtual straight line, and the first width is greater than a third width between a second edge portion of the non-display area and the non-circular area in the virtual straight line.

14. The display device of claim 9, wherein the plurality of lines comprises:

the display panel of claim 1, wherein at least one selected from the first to fourth lines comprises:

a first portion and second portion in the display area; and a curved portion in the non-display area, the curved portion being disposed on a different layer from the first portion and the second portion, wherein the curved portion is electrically connected to the first portion and the second portion via contact holes of an insulation layer that is between the curved portion and the first and second portions.

15. The display device of claim 9, wherein each of the first and second components comprises a sensor or a camera.

16. The display device of claim 9, wherein each of the first and second components comprises a sensor or a camera.

17. The display device of claim 9, wherein the substrate of the display panel comprises at least one opening corresponding to at least one selected from the circular area and the non-circular area.

18. The display device of claim 9, wherein the substrate of the display panel comprises at least one opening corresponding to at least one selected from the circular area and the non-circular area.

19. The display device of claim 9, wherein the display device comprises a mobile phone, a note-book computer, or a smart watch.

* * * * *